(12) United States Patent  (10) Patent No.: US 8,089,810 B2
Kawase et al.  (45) Date of Patent: *Jan. 3, 2012

(54) SEMICONDUCTOR INTEGRATED CIRCUIT DEVICE FOR DRIVING LIQUID CRYSTAL DISPLAY

(75) Inventors: Yasushi Kawase, Nanae (JP); Susumu Ishida, Nanae (JP); Takesada Akiba, Nanae (JP); Yasushi Nagata, Nanae (JP); Naoki Miyamoto, Nanae (JP); Kazuyoshi Shiba, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/890,642

(22) Filed: Sep. 25, 2010

(65) Prior Publication Data

US 2011/0012906 A1    Jan. 20, 2011

Related U.S. Application Data

(63) Continuation of application No. 11/441,166, filed on May 26, 2006, now Pat. No. 7,826,264.

(30) Foreign Application Priority Data

May 30, 2005 (JP) .................................. 2005-157390

(51) Int. Cl.
*G11C 11/34* (2006.01)
(52) U.S. Cl. .............................. 365/185.11; 365/185.24
(58) Field of Classification Search ............. 365/185.11, 365/185.24
See application file for complete search history.

(56) References Cited

U.S. PATENT DOCUMENTS

| 4,870,402 | A | * | 9/1989 | DeLuca et al. ............... 340/7.51 |
| 5,230,673 | A | * | 7/1993 | Maeyama et al. ................ 482/5 |
| 5,444,664 | A | * | 8/1995 | Kuroda et al. ................ 365/226 |
| 5,475,402 | A | * | 12/1995 | Hijikata ........................ 345/211 |
| 6,128,025 | A | * | 10/2000 | Bright et al. .................. 345/504 |
| 6,394,614 | B1 | * | 5/2002 | Chang ............................ 359/604 |
| 6,693,673 | B1 | * | 2/2004 | Tanaka et al. ................. 348/371 |
| 7,271,799 | B2 | | 9/2007 | Iwata et al. |
| 7,274,594 | B2 | * | 9/2007 | Pascucci et al. ......... 365/185.11 |
| 7,826,264 | B2 | * | 11/2010 | Kawase et al. ........... 365/185.11 |
| 7,907,449 | B2 | * | 3/2011 | Lee et al. ................. 365/185.17 |
| 2002/0043717 | A1 | * | 4/2002 | Ishida et al. |
| 2002/0158823 | A1 | * | 10/2002 | Zavracky et al. ............... 345/87 |
| 2003/0043140 | A1 | * | 3/2003 | Ko et al. ........................ 345/211 |
| 2003/0137527 | A1 | * | 7/2003 | Lin et al. ....................... 345/698 |
| 2003/0148922 | A1 | * | 8/2003 | Knapp et al. ..................... 514/1 |
| 2004/0252115 | A1 | * | 12/2004 | Boireau ....................... 345/211 |

(Continued)

FOREIGN PATENT DOCUMENTS

CN            1100823 A   *   3/1995

(Continued)

*Primary Examiner* — Michael Tran
(74) *Attorney, Agent, or Firm* — Miles & Stockbridge P.C.

(57) ABSTRACT

The present invention realizes a semiconductor integrated circuit device for driving liquid crystal (liquid crystal control driver IC) capable of easily setting drive conditions and the like according to specifications of a liquid crystal display to be used. An electrically-programmable nonvolatile memory circuit (EPROM) or an electrically erasable and programmable nonvolatile memory circuit (EEPROM) is provided in a semiconductor integrated circuit device for driving a liquid crystal display, and setting information is stored in the memory circuit. The memory circuit is constructed by a normal device which can be formed in the same process as a semiconductor manufacturing process of forming devices of other circuits.

4 Claims, 16 Drawing Sheets

U.S. PATENT DOCUMENTS

2005/0051168 A1 * 3/2005 DeVries et al. .......... 128/204.21

FOREIGN PATENT DOCUMENTS

| | | | | |
|---|---|---|---|---|
| CN | 1353500 | A | * | 6/2002 |
| JP | 2000-148064 | | | 5/2000 |
| JP | 2000148064 | A | * | 5/2000 |
| JP | 2002-149206 | A | | 5/2002 |
| JP | 2002149206 | A | * | 5/2002 |
| JP | 2003-241730 | A | | 8/2003 |
| JP | 2004-341132 | A | | 12/2004 |

* cited by examiner

SEMICONDUCTOR INTEGRATED CIRCUIT DEVICE FOR DRIVING LIQUID CRYSTAL DISPLAY

CROSS-REFERENCE TO RELATED APPLICATIONS

This application is a continuation application Ser. No. 11/441,166 filed May 26, 2006 now U.S. Pat. No. 7,826,264, issued Nov. 2, 2010. The present application also claims priority from Japanese patent application No. 2005-157390 filed on May 30, 2005, the content of which is hereby incorporated by reference into this application.

BACKGROUND OF THE INVENTION

The present invention relates to a semiconductor integrated circuit device for driving liquid crystal (a liquid crystal control driver IC) that drives a liquid crystal display panel and, more particularly, to a technique effectively used for a liquid crystal control driver IC having means for setting characteristics and specifications of a liquid crystal display panel used in a non-volatile manner.

In recent years, as displays of portable electronic devices such as cellular phones and PDA (Personal Digital Assistants), generally, dot-matrix-type liquid crystal panels in each of which a plurality of display pixels are arranged two-dimensionally in a matrix are used. In a device, a display controller (liquid crystal controller IC) formed in a semiconductor integrated circuit for controlling display of the liquid crystal panel and a driver circuit for driving the liquid crystal panel or a liquid crystal display driver (liquid crystal control driver IC) having therein such a driver circuit are mounted.

The specifications such as gamma characteristic, drive voltage, operation clock frequency, and the like of a liquid crystal display vary according to kinds of liquid crystals used and driving methods, and the characteristics vary due to manufacture variations. Manufacturers providing liquid crystal display drivers construct liquid crystal display drivers so as to be adapted to liquid crystal displays of different specifications and liquid crystal displays having manufacture variations. The manufactures are devising methods of increasing versatility of the drivers and decreasing the manufacture cost.

Hitherto, as a measure for enabling liquid crystal displays of different specifications to be driven, a method is practically used in which a register is provided in a liquid crystal display driver. Simultaneously, a nonvolatile memory such as an EPROM is provided on the outside. For initial setting or the like at power-on, setting information such as drive conditions is transferred from the nonvolatile memory to the register on the inside. Another method has been also proposed. A setting circuit having a fuse and the like is provided in a liquid crystal display driver. On determination of a liquid crystal display applied, setting is performed by disconnecting a fuse in accordance with the specifications of the liquid crystal display. An invention of adjusting operation characteristics of a liquid crystal driver by using fuses is disclosed in, for example, Japanese Unexamined Patent Publication No. 2000-148064.

SUMMARY OF THE INVENTION

The method of setting information from the external ROM to the register as one of the conventional methods of setting drive conditions has to make the setting each time the power is turned on, so that it has a drawback that the load on a CPU is heavy and starting of the system is slow. In the method using a fuse, once setting is made, the setting cannot be changed. The method cannot address to a change in a liquid crystal display used or specifications of the display after the setting, and the user cannot make setting. The method therefore has a drawback of low usability.

Further, in the case where characteristic of a circuit or the like is deviated from a desired value due to manufacture variations, generally, the deviation can be adjusted by setting a resistance value or a capacitance value of a resistor, a capacitor, or the like. In a liquid crystal display and a liquid crystal driver, external devices are used as a diode for protection, a capacitor for boosting, and the like. The external devices are mounted together with a liquid crystal driver IC on a flexible board or the like. Consequently, there are drawbacks such that the number of external parts is relatively large so that it is difficult to miniaturize the apparatus, and the number of external terminals of the liquid crystal driver IC is increased due to the external devices and the chip size is accordingly increased.

An object of the present invention is to provide an easy-to-use semiconductor integrated circuit device for driving liquid crystal capable of easily setting driving conditions and the like in accordance with specifications of a liquid crystal display used.

Another object of the invention is to provide a semiconductor integrated circuit device for driving liquid crystal, capable of adjusting a characteristic of a liquid crystal display or the semiconductor integrated circuit device for driving liquid crystal, which is deviated from a desired value due to manufacture variations and, moreover, realizing a smaller number of external parts and miniaturization of a chip.

The above and other objects and novel features of the present invention will become apparent from the description of the specification and the attached drawings.

Outlines of representative ones of inventions disclosed in the application will be described as follows.

An electrically-programmable nonvolatile memory circuit (EPROM) or an electrically erasable and programmable nonvolatile memory circuit (EEPROM) is provided in a semiconductor integrated circuit device for driving a liquid crystal display, and setting information is stored in the memory circuit. The memory circuit is constructed by a normal device which can be formed in the same process as a semiconductor manufacturing process of forming devices of other circuits.

By providing the semiconductor integrated circuit device for driving liquid crystal with the built-in nonvolatile memory circuit, it becomes unnecessary to read setting information each time the power is turned on unlike the method of using an external ROM and a register. Consequently, there are advantages such that the load on the CPU is lightened and the system starts more promptly. In particular, in the case of performing resetting operation at the time of starting a liquid crystal display applied to a cellular phone or the like, the liquid crystal display may be reset when the power of the cellular phone is turned on and when the liquid crystal display changes from the standby state to an active state. In such a case, a microprocessor has to set initial values to various devices (RF module, power supply circuit, memory, semiconductor circuit for controlling the liquid crystal display, and the like), so that the operation load on the microprocessor is heavy. Consequently, hastening of the setting at power-on in the semiconductor integrated circuit device for driving liquid crystal is extremely effective at reducing the load of the CPU and quickening the start-up of the system.

By providing the built-in nonvolatile memory circuit, identification information (chip ID or module ID) of the chip or the liquid crystal display including the chip can be written in advance. Therefore, it is advantageous for a user or the like which constructs a liquid crystal display by using a semiconductor integrated circuit device having therein the nonvolatile memory circuit, by utilizing the ID, various managements become possible. The ID can be stored by using the remaining region after other setting information is written.

A device which can be formed by the semiconductor manufacturing process for forming devices constructing other circuits denotes a general device which is not a nonvolatile memory device called an FAMOS having a floating gate. Generally, a memory IC called EPROM or EEPROM is constructed by using a nonvolatile memory device having a structure which is more complicated as compared with normal devices. Therefore, the manufacturing cost is high due to a larger number of masks and the like.

If a nonvolatile memory circuit which can be constructed only by normal devices is internally provided to store setting information, a memory circuit capable of easily setting drive conditions and the like in accordance with specifications of a liquid crystal display used and, even if the drive conditions and the like are changed, easily changing the setting can be realized at low cost. According to the invention, a deviation of characteristics can be adjusted by changing a set value stored in a built-in nonvolatile memory circuit without using an external device. Thus, the number of external parts and the number of terminals for connecting external devices can be reduced.

Effects obtained by the representative ones of the inventions disclosed in the application will be briefly described as follows.

According to the invention, the easy-to-use semiconductor integrated circuit device capable of easily setting drive conditions and the like in accordance with specifications of a liquid crystal display used.

According to the invention, even if a characteristic is deviated from a desired value due to manufacture variations, it can be adjusted without using external devices. Thus, there is an effect such that a semiconductor integrated circuit device for driving liquid crystal, realizing the reduced number of external parts and miniaturization of the chip can be realized.

DETAILED DESCRIPTION OF THE PREFERRED EMBODIMENTS

Preferred embodiments of the present invention will be described hereinbelow with reference to the drawings.

Figure 1:
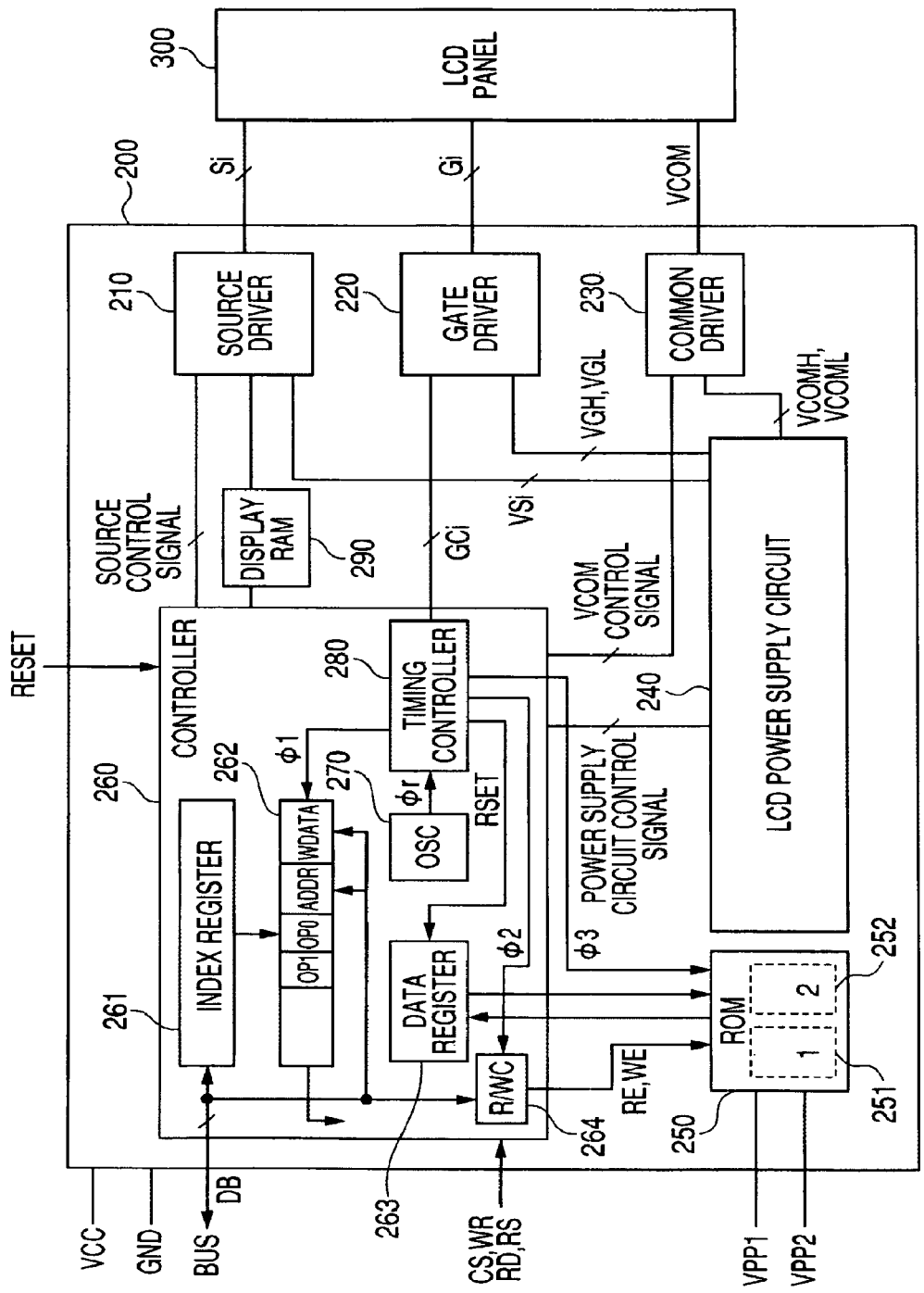
FIG. 1 is a block diagram showing the configuration of a liquid crystal display system constructed by a liquid crystal control driver IC having therein a nonvolatile memory circuit and a TFT liquid crystal panel driven by the driver IC.

First, a semiconductor integrated circuit device for driving liquid crystal (liquid crystal control driver IC) 200 having therein a nonvolatile memory circuit to which the present invention is effectively applied will be described with reference to FIG. 1. FIG. 1 is a block diagram showing the configuration of a liquid crystal display system constructed by the liquid crystal control driver IC 200 having therein a nonvolatile memory circuit and a TFT liquid crystal panel 300 driven by the driver.

In FIG. 1, 200 denotes the liquid crystal control driver IC for driving a liquid crystal panel by an active matrix method to perform displaying, and 300 denotes the TFT liquid crystal panel 300 driven by the liquid crystal control driver IC 200. In the TFT liquid crystal panel 300, source lines (source electrodes) as a plurality of signal lines to which an image signal is applied and gate lines (gate electrodes) as a plurality of selection scan lines sequentially selectively driven in predetermined cycles are disposed in directions orthogonal to each other on one of facing two glass substrates.

Pixels each constructed by a pixel electrode and a TFT (thin film transistor) as a switching element for applying a voltage according to an image signal on a source line to the pixel electrode are arranged in matrix at intersections of the source lines and the gate lines. On the other facing glass substrate, electrodes common to the pixels are provided. A liquid crystal is sealed between the two glass substrates on which the electrodes are formed. Since the TFT liquid crystal panel 300 having such a configuration is known, it is not shown.

The liquid crystal control driver IC 200 has a source driver 210 for driving the source lines SL of the liquid crystal panel 300 in accordance with an image signal, a gate driver 220 sequentially scanning gate lines GL of the TFT liquid crystal panel 300, and a common driver 230 for applying a common voltage VCOM to an electrode common to the pixels of the TFT liquid crystal panel 300. The driver IC 200 also has an LCD power supply circuit 240 for generating drive voltages necessary for the drivers 210 to 230, a nonvolatile memory circuit 250 for storing setting information such as drive conditions, and a controller 260 for controlling the inside of the whole chip on the basis of a command from an external microprocessor (hereinbelow, also called an MPU or CPU) or the like.

Further, the driver IC 200 includes an oscillator 270 for generating a clock $\phi r$ as an internal reference, a timing controller 280 for generating signals $\phi 1$, $\phi 2$, and $\phi 3$ which give operation timings of the drivers 210 to 230 and the like on the basis of the generated reference clock $\phi r$, and a display RAM 290 for storing image data to be displayed on the liquid, crystal panel 300. The driver IC 200 having those circuits is constructed as a semiconductor integrated circuit on a single semiconductor chip made of single crystal silicon or the like.

The driver IC 200 has an external terminal to which a power supply voltage VCC is applied and an external terminal to which a ground potential GND is applied. In addition, the driver IC 200 has external terminals to which write voltages VPP1 and VPP2 higher than the voltage VCC necessary to write data to the nonvolatile memory circuit 250 are applied.

The controller 260 of the embodiment includes an index register 261 for setting a command code, a control register 262 to which data is written on the basis of the data of the index register 261, a data register 263 for registering data supplied from the outside and data read from the nonvolatile memory circuit 250, and a read/write control circuit 264 for performing read/write control on the nonvolatile memory circuit 250.

The controller 260 of the embodiment employs a method of designating a command to be executed which is written in the index register 261 by an external MPU and generating a control signal. As a control method of the controller 260, a method of receiving a command code from an external MPU, decoding the command code, and generating a control signal may be also employed. The data register 263 is provided for an output part of the nonvolatile memory circuit 250, and the controller 260 may be provided with a gate circuit for distributing read data held in the data register 263 to a desired circuit.

Under control of the controller 260 constructed as described above, the liquid crystal control driver IC 200 performs a rendering process of sequentially writing display data to the display RAM 290 at the time of displaying an image on the above-described TFT liquid crystal panel 300 on the basis of a command and data from an external MPU. The controller 260 also performs a reading process of sequentially reading display data from the display RAM 290 and makes a signal applied to the source line SL in the TFT liquid crystal panel 300 and signals to be applied to the gate line GL and the common electrode COM output from the drivers 210, 220, and 230, thereby performing liquid crystal display.

The nonvolatile memory circuit 250 for storing setting information such as a drive condition is constructed by the same element (a CMOS transistor in the embodiment) as that of another circuit as described later. With the configuration, the number of manufacture processes for forming the nonvolatile memory circuit 250 is not increased, and rise in the manufacturing cost is suppressed. The setting information stored in the nonvolatile memory circuit 250 is roughly divided into two kinds of setting information; setting information to be stored in a manufacturer (vendor), and setting information to be stored in a user (assembly manufacturer). In actual use, one or both of the two kinds of setting information can be set.

In the liquid crystal control driver IC of the embodiment, the nonvolatile memory circuit 250 has a first region 251 for storing information to be set by a manufacturer and a second region 252 for storing information to be set by the user. In the first region 251, data can be written only once. In the second region 252, data can be written a plurality of times.

The setting information to be stored in a manufacturer includes information for setting the frequency of the clock $\phi r$ generated by the oscillator 270 for generating a clock as an internal reference, and information for setting timings of clocks generated by the timing controller 280 for generating the operation clocks $\phi 1$, $\phi 2$, $\phi 3$, . . . on the basis of the reference clock $\phi r$. Information for setting the level of a voltage generated by the LCD power supply circuit 240 for generating a drive voltage necessary for the drivers 210 to 230 is also included in the setting information to be stored in a manufacturer. The oscillator 270, timing controller 280, LCD power supply circuit 240, and the like are constructed to be changeable in accordance with the corresponding setting information which is read from the nonvolatile memory circuit 250.

Figure 2:
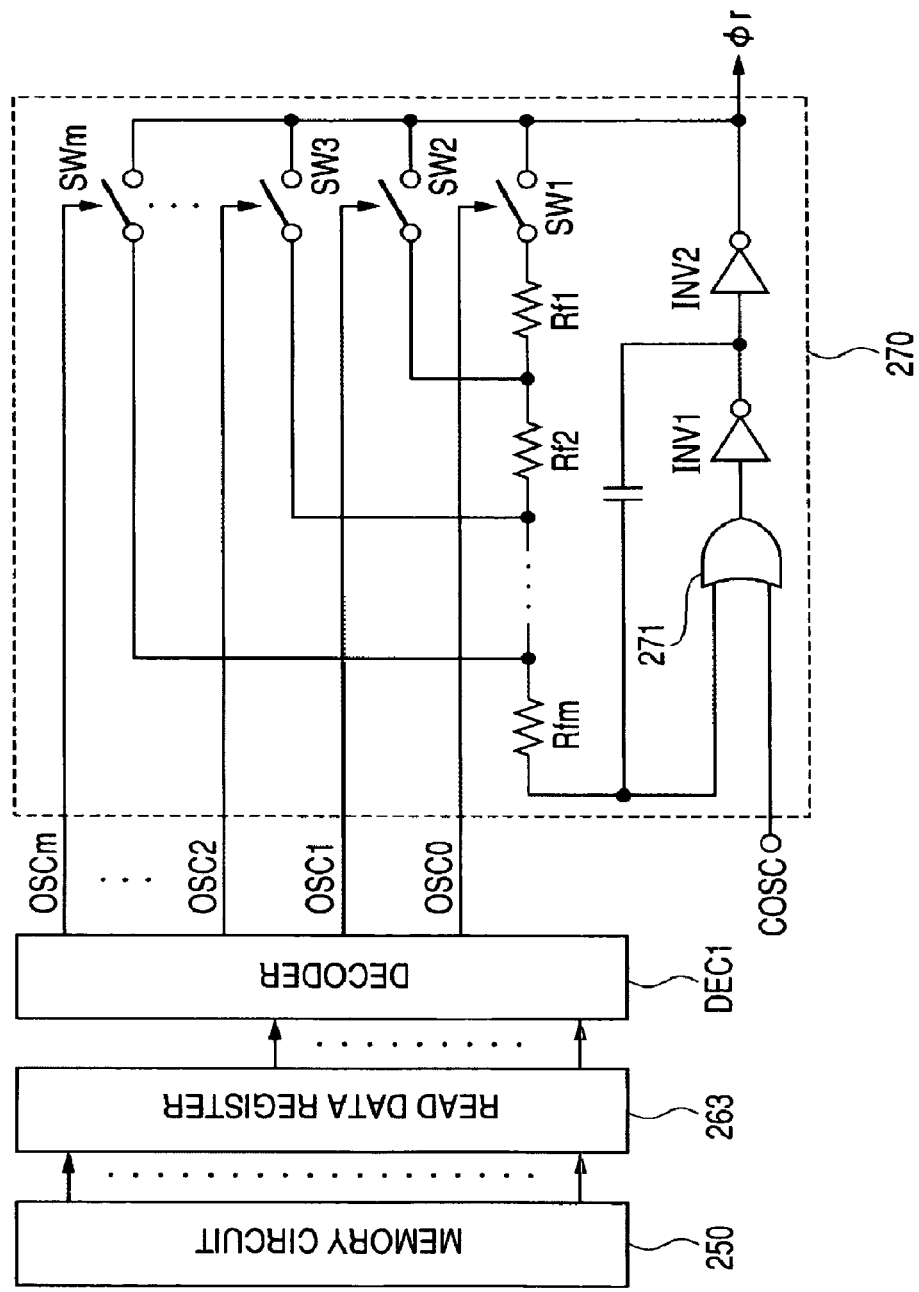
FIG. 2 is a block diagram showing an example of an oscillator in the liquid crystal control driver to which the invention is applied.

FIG. 2 shows a configuration example of the oscillator 270. The oscillator 270 in the embodiment is a ring oscillator including an OR gate 271, inverters INV1 and INV2 connected in series, and a feedback path. Switching elements SW1, SW2, . . . , and SWm are provided between connection nodes of a plurality of registers Rf1, Rf2, . . . , and Rfm connected in series and provided on the feedback path extending from the inverter INV2 in the final stage to the OR gate 271 in the first stage and the output terminal of the oscillator.

A decoder DEC1 for decoding the corresponding setting information which is read from the nonvolatile memory circuit 250 and held in the data register 263 is provided. According to an output of the decoder DEC1, any of the switching elements SW1, SW2, . . . , and SWm is turned on. By the operation, delay time of a feedback signal is changed and the frequency of the reference clock $\phi r$ as an output of the oscillator is changed. As a result, even in the case where the frequency of the oscillator is deviated from the desired frequency due to manufacture variations, the deviation of the frequency can be adjusted. Moreover, the frequency can be changed to the frequency of a specification adapted to a liquid crystal display.

A signal COSC supplied to the other input terminal of the OR gate 271 in the first stage of the oscillator to which the feedback signal is input is an oscillator activation signal. When the signal COSC is set to the low level, the oscillator oscillates. When the signal COSC is set to the high level, the oscillator stops oscillating. Another configuration may be also employed in which the decoder DEC1 is not provided and the switching elements SW1, SW2, . . . , and SWm are directly controlled according to the setting information held in the data register 263.

Figure 3:
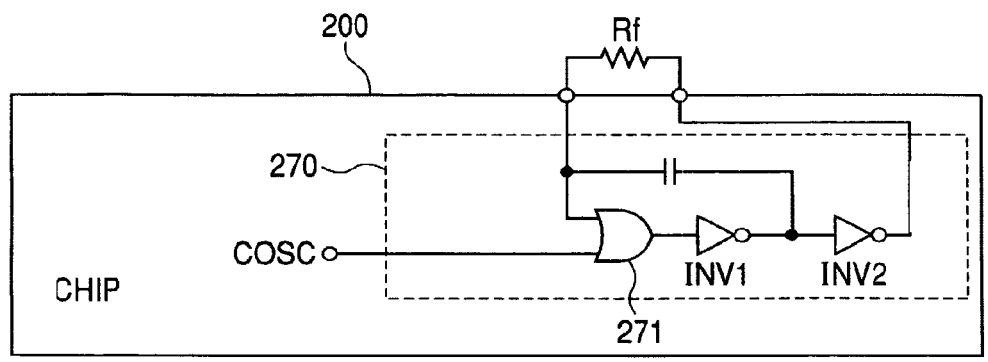
FIG. 3 is a circuit diagram showing an example of an oscillator whose frequency can be adjusted by using an external device.

When a built-in memory and an adjustment circuit are not provided, to change the frequency of the reference clock $\phi r$, generated by the oscillator 270, for example, as shown in FIG. 3, a resistor Rf provided for the feedback path is connected as an external device to the driver IC 200 and the resistance value of the resistor Rf has to be changed. According to the embodiment, such an external device is unnecessary, so that the number of external parts can be reduced and the system can be miniaturized. Further, the number of external terminals for connecting the external devices can be also reduced, so that the chip itself can be also miniaturized.

Figure 4:
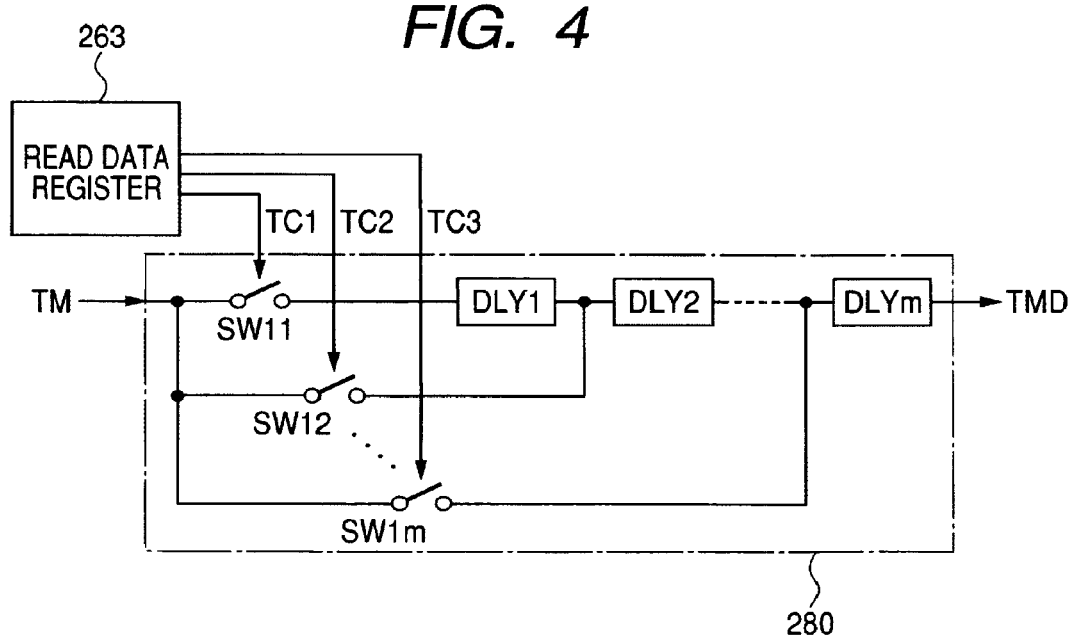
FIG. 4 is a circuit diagram showing an example of a timing controller.

FIG. 4 shows a configuration example of the timing controller 280. The timing controller 280 of the embodiment is constructed by a plurality of delay circuits DLY1, DLY2, . . . , and DLYn connected in series. Switching elements SW11, SW12, . . . , and SW1m are provided between the connection nodes of the delay circuits DLY1, DLY2, . . . , and DLYn and the input terminal of the controller.

By turning on any of the switching elements SW11, SW12, . . . , and Sw1m by a signal TC1, TC2, TC3, or the like of corresponding setting information which is read from the nonvolatile memory circuit 250 and held in the data register 263, the timing of an output signal TMD is changed. It is also possible to provide a decoder for decoding setting information held in the data register 263 and control the switching elements SW11, SW12, . . . , and SW1m in accordance with an output of the decoder.

An example of a signal whose timing is adjusted by the timing controller 280 is a signal for giving an operation timing of the display RAM 290. Since the display RAM 290 is a circuit which operates at the highest speed in the liquid crystal control driver, a deviation of the operation timing exerts an influence on the operations of the whole system. By adjusting the signal for giving an operation timing of the display RAM 280 in the initial setting, desired operation characteristics are obtained.

Figure 5:
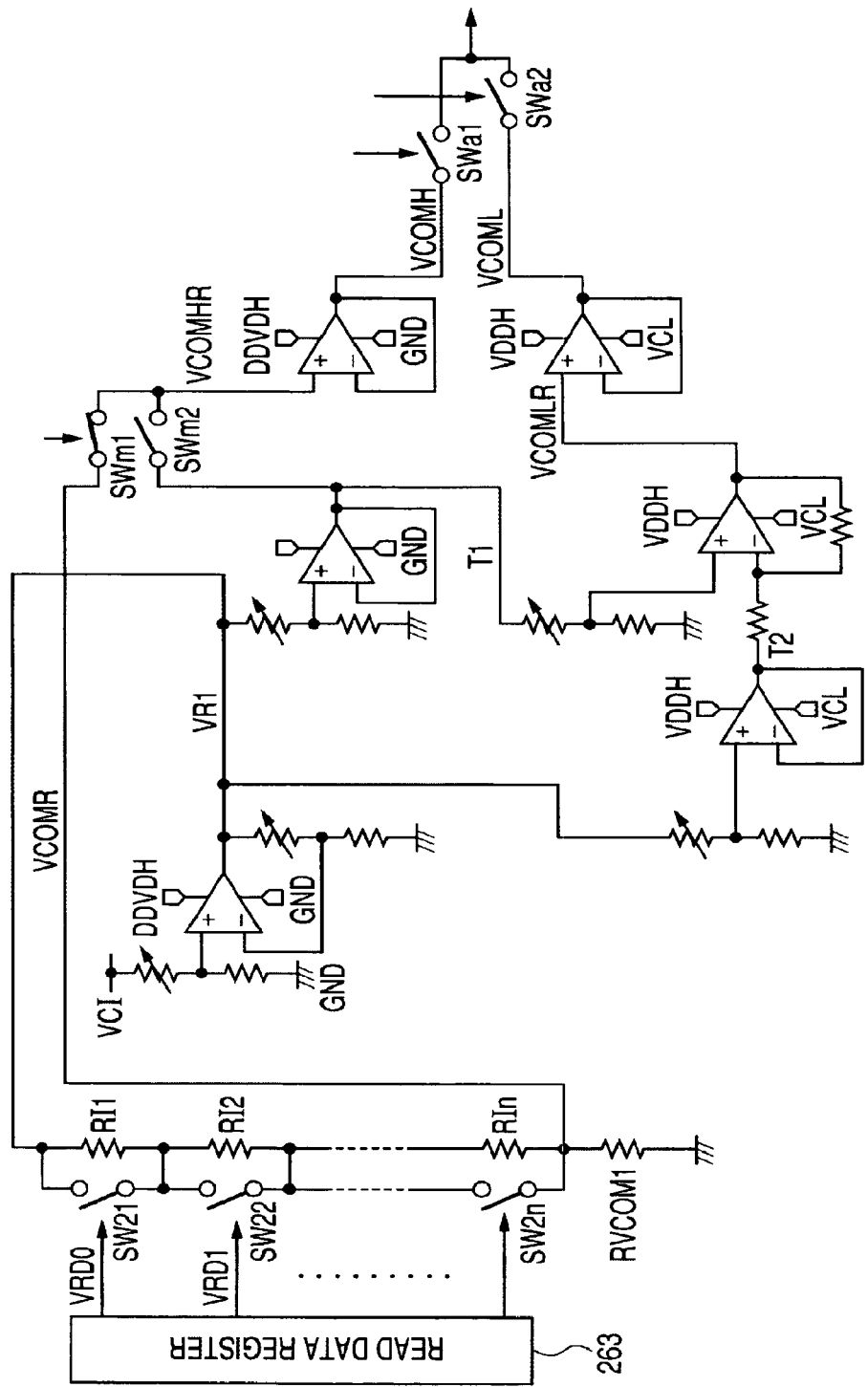
FIG. 5 is a circuit diagram showing an example of an LCD power supply circuit.

FIG. 5 shows a configuration example of the LCD power supply circuit 240. The LCD power supply circuit 240 of the embodiment has ladder resistors RI1, RI2, . . . , and RIn connected in series and switching elements SW21, SW22, . . . , and SW2n connected in parallel with the ladder resistors. The switching elements SW21, SW22, . . . , and SW2n are turned on/off according to corresponding setting information which is read from the nonvolatile memory circuit 250 and held in the data register 263. By the operation, the level of a reference voltage VCOMR in the LCD power supply circuit 240 is determined.

In FIG. 5, switches SWa1 and SWa2 provided in the LCD power supply circuit 240 are switches for inverting the polarity by switching between common potentials VCOMH and VCOML to be applied to the common electrode in predetermined cycles to drive a liquid crystal panel with alternating current in order to prevent degradation of the liquid crystal. Switches SWm1 and SWm2 are switches for switching the level of the common potential VCOMH as one of the common potentials VCOMH and VCOML to be applied to the common electrode in accordance with a display mode or the like. The switches SWa1 and SWa2 (and the switches SWm1 and SWm2) operate complementarily to each other in accordance with a control signal from the controller 260. Specifically, when one of the switches SWa1 and SWa2 (SWm1 and SWm2) is turned on, and the other switch is turned off.

Figure 6:
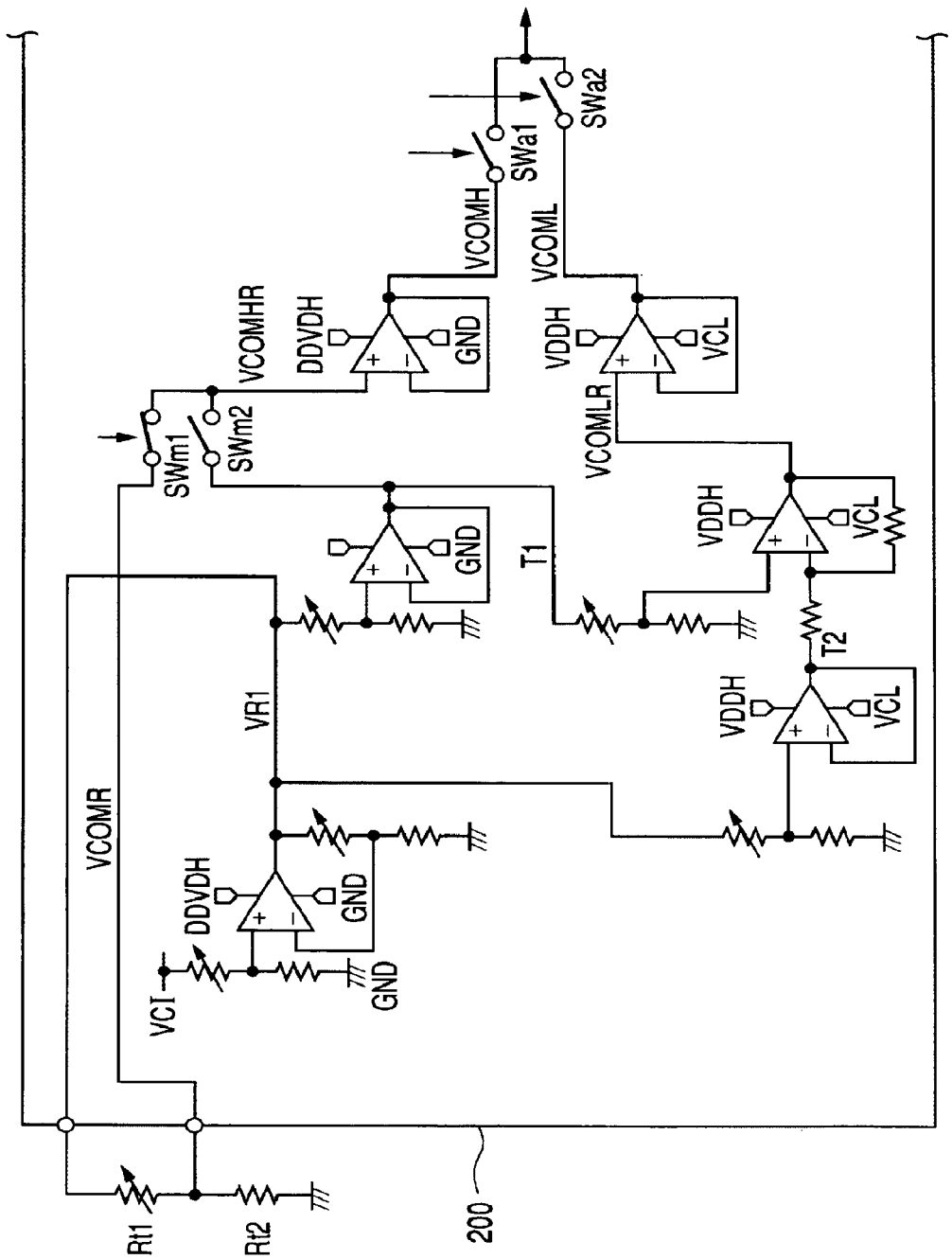
FIG. 6 is a circuit diagram showing an example of an LCD power supply circuit whose voltage can be adjusted by using an external device.

When a built-in memory and an adjustment circuit are not provided, to change the level of the reference voltage VCOMR, for example, as shown in FIG. 6, external resistors Rt1 and Rt2 are provided for the driver IC 200 and the resistance value of the resistor Rt1 as one of the resistors is changed. According to the embodiment, such an external device is unnecessary, so that the number of external parts can be reduced and the system can be miniaturized. Further, the number of external terminals for connecting the external devices can be also reduced, so that the chip itself can be also miniaturized.

Figure 7:
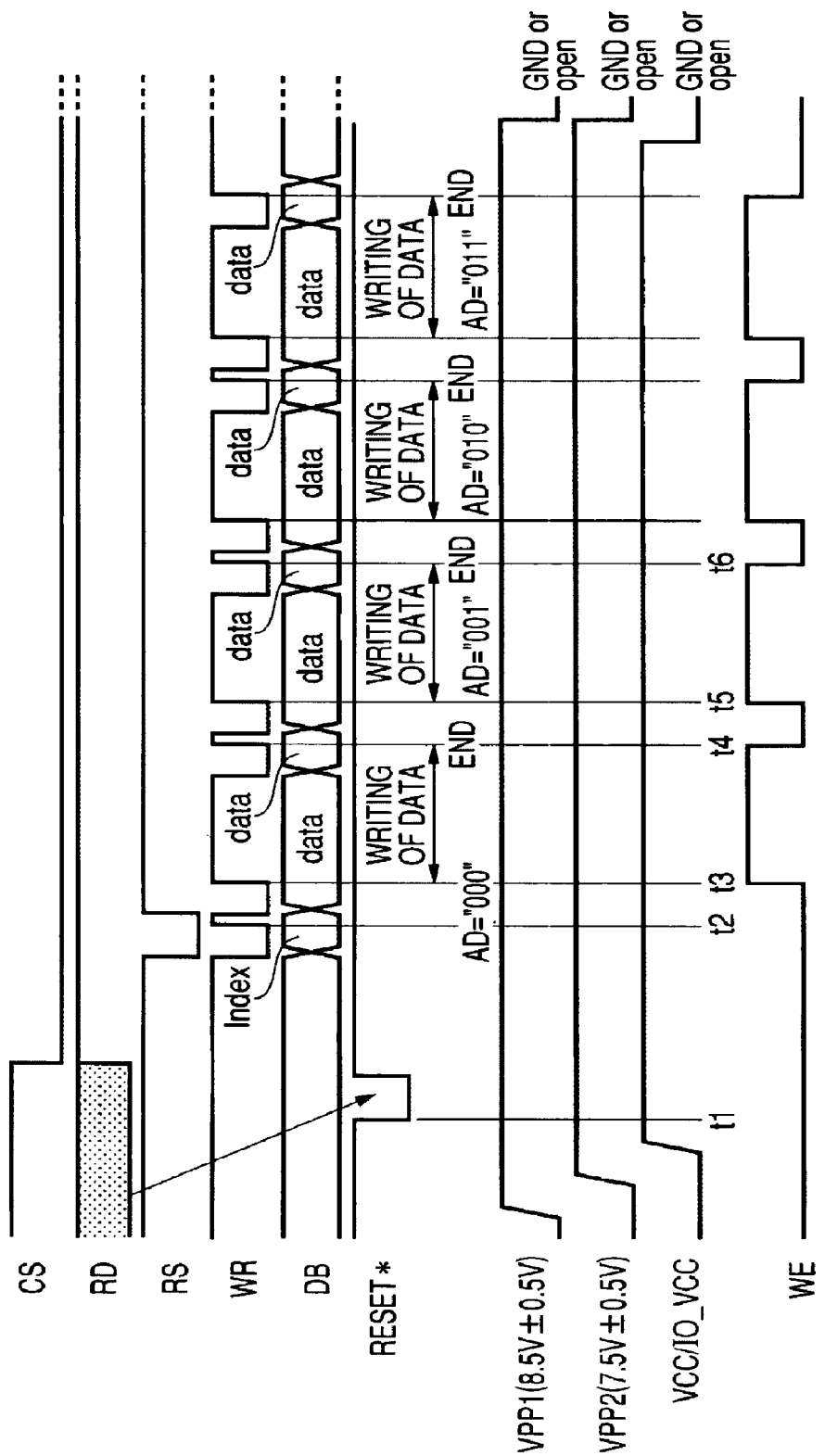
FIG. 7 is a timing chart showing operation timings in writing operation of a nonvolatile memory circuit (ROM) in the liquid crystal control driver IC of the embodiment of FIG. 1.

Next, a writing procedure and operation timings of the nonvolatile memory circuit 250 by the controller 260 will be described with reference to FIGS. 1 and 7. In FIG. 7, signals CS, RS, WR, and RD are control signals which are input from the outside of the chip to the read/write control circuit 264.

The control signal CS is a signal indicating that the chip is selected, RS is a signal indicating that data DB is latched in the index register or the control register, WR is a signal for controlling the writing operation, and RD is a signal for controlling the reading operation. The read/write control circuit 264 generates a signal to be supplied to the memory circuit 250 on the basis of the control signals CS, RS, WR, and RD and the clock $\phi 2$ from the timing controller 280. WE denotes a write enable signal generated by the read/write control circuit 264 and supplied to the memory circuit 250. RE denotes a read enable signal generated by the read/write control circuit 264 and supplied to the memory circuit 250.

FIG. 7 show writing operation timings of the nonvolatile memory circuit 250 by the controller 260.

Description of the writing operation relates to, although not limited, the case where when a reset signal RESET is input from an MPU after power-on, the level changes from the high level to the low level. FIG. 7 shows an example of writing data to four addresses 000, 001, 010, and 011.

First, when the reset signal RESET is input, the register in the chip is reset (timing t1 in FIG. 7). Subsequently, index data is input to the driver IC via a control bus BUS connected to the MPU or the like in the period in which the signal RS is at the low level. At the timing when the signal WR changes from the low level to the high level, the index data is stored in the index register 261 (timing t2 in FIG. 7).

According to the index data stored in the index register 261, the control register 262 as a ROM-type circuit is selected. After the timing t2, data of control or the like (hereinbelow, simply called "data") is input to the driver IC from the control bus BUS in the period in which the signal RS is at the high level. At the timing when the signal WR changes from the low level to the high level, the data is stored in the control register 262 (timing t3 in FIG. 7).

Writing Period

At the timing t3, data of the control register is ascertained. The data includes write data WDATA, a write address ADDR, ROM control data OP0 and OP1, and the like. In the case of writing, the control data OP0 is changed from 0 (low) to 1 (high). At this time, when OP0 is 1 (high), the read/write control circuit 264 is controlled to assert the write enable signal WE to the high level, thereby performing writing operation.

After completion of the writing operation, by changing the data OP0 of the control register from 1 (high) to 0 (low) in the period in which the control signal RS of the control bus BUS is at the high level, the read/write control circuit 264 is controlled to negate the write enable signal WE to the low level. It finishes the writing operation (timing t4 in FIG. 7).

In the case of restarting the writing operation while changing the address, the data OP0 of the control register is changed from 0 (low) to 1 (high) in the period in which the control signal RS is at the high level (timing t5 in FIG. 7). Since the data OP0 is 1 (high), the read/write control circuit 264 asserts the write enable signal WE to the high level to perform the writing operation. At this time, the address of the data register is updated. By the operation, data is written to a region of an address different from the address to which data is written in the period between the timings t3 and t4.

After the timing t5, by setting the data OP0 of the control register in a manner similar to the setting in the period from the timing t3 to the timing t4, writing is finished (timing t6 in FIG. 7). After that, the above operations are repeated.

Although the configuration of executing the writing operation in accordance with the control signals CS, RS, WR, and RD input from the outside has been described in the embodiment, another configuration may be also employed. A ROM in which a plurality of microcommand codes corresponding to one command code are stored is provided in the chip. When a write command is set in the index register 261, the microcommand code is read, a control signal to the read/write control circuit 264 is generated, and the writing operation is automatically executed. By employing a control method according to a control signal from the outside like in the embodiment, the scale of the controller 260 can be reduced.

Figure 8:
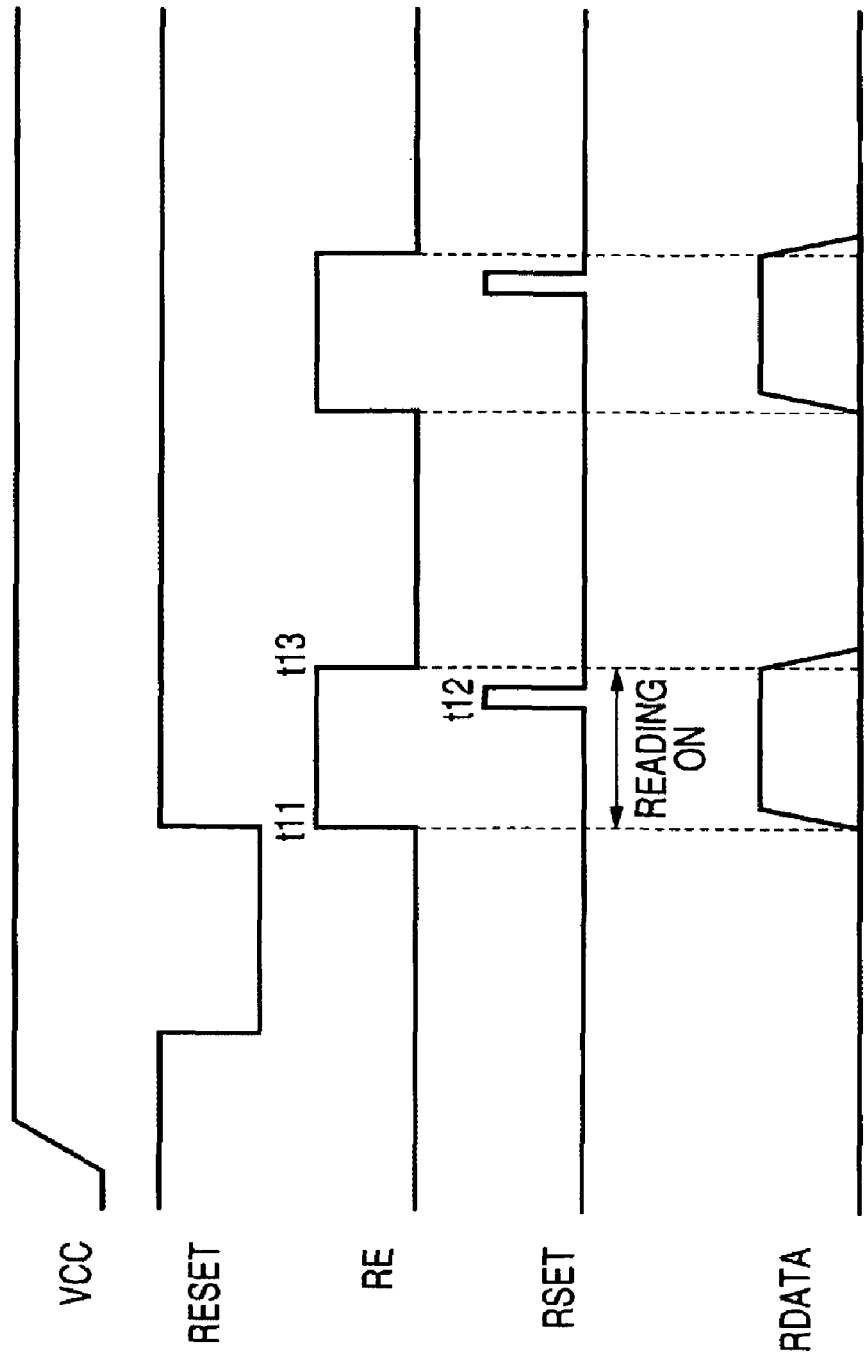
FIG. 8 is a timing chart showing operation timings in reading operation of the nonvolatile memory circuit (ROM).

FIG. 8 shows reading operation timings of the nonvolatile memory circuit 250 by the controller 260. RE denotes a read enable signal generated by the read/write control circuit 264 and supplied to the memory circuit 250.

In the liquid crystal control driver of the embodiment, after power-on, the reset signal RESET is asserted from the high level to the low level from the MPU, thereby resetting the register in the chip. When a read command is set in the index register 261, "1" is set in a predetermined control bit OP1 in the control register 262 by the index register 261, the read enable signal RE is asserted to the high level by the read/write control circuit 264, and the reading operation starts (timing t11). At this time, the control bit OP0 is set to "0".

A read address RADDR stored in a predetermined field in the control register 262 is supplied to the memory circuit 250 and the data reading operation is executed. Data stored in a region corresponding to the address supplied to the memory circuit 250 is read in a lump. In place of providing the control bit OP1 for reading in the control register 262, it is also possible to send the reset signal RESET to a proper delay circuit or the like, use an output of the delay circuit as a start signal of the read/write control circuit 264, and output high-level read enable signal RE.

Subsequently, a signal RSET indicative of a latch timing is output from the timing controller 280 after lapse of predetermined time, and data read from the memory circuit 250 is latched by the data register 263 (timing t12). After that, the read control signal RE to the nonvolatile memory circuit 250 is negated to the low level, thereby finishing the single reading operation (timing t13).

When read data is stored in a plurality of addresses, the read address RADDR stored in a predetermined field in the control register 262 is updated while the read enable signal RE is negated to the low level, and the above-described operations are repeated.

In the embodiment, when the reset signal RESET is input, "1" is set in the predetermined control bit OP1 in the control register 262 by the index register 261, thereby generating the read enable signal RE. Alternately, the read enable signal RE may be generated by passing the reset signal RESET to a proper delay circuit or the like. The liquid crystal control driver IC of the embodiment can be constructed so that the read/write control circuit 264 reads data from the memory circuit 250 on the basis of the control signals CS, RS, WR, and RD. The reading function may be validated, for example, in a test mode of testing whether the circuit operates normally or not.

Figure 9:
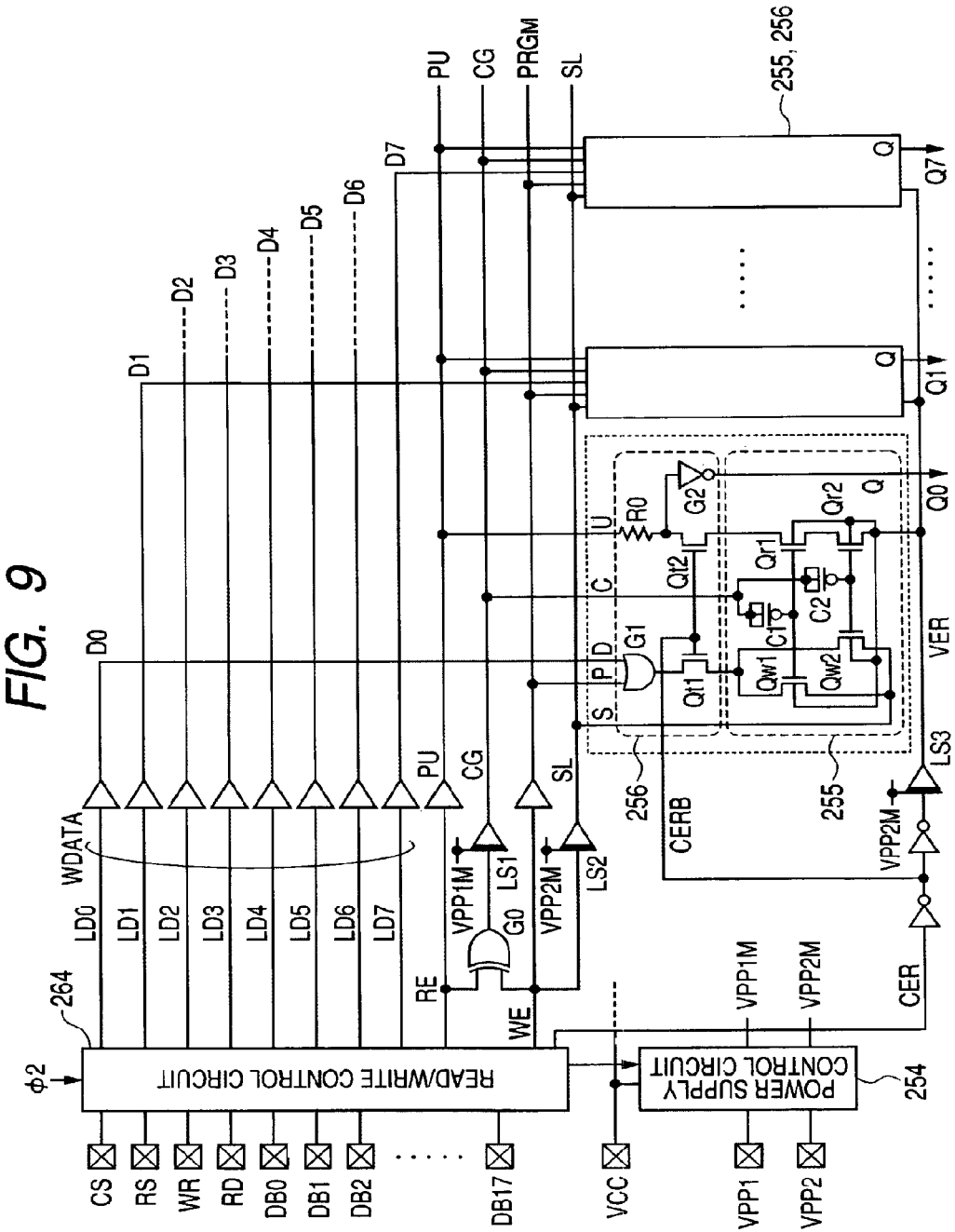
FIG. 9 is a circuit diagram showing a concrete construction example of a memory circuit suitable for a manufacturer information storing region in the nonvolatile memory circuit.

FIG. 9 shows an example of a memory circuit suitably used for the first region 251 for storing information to be set by a manufacturer in the nonvolatile memory circuit 250 of FIG. 1. The nonvolatile memory circuit 250 of the embodiment is constructed only by P-channel MOSFETs (insulated gate type field effect transistors) and N-channel MOSFETs as normal circuit configuration elements without using nonvolatile memory elements such as FAMOS and MNOS. Although FIG. 7 shows the memory circuit having a storage capacity of one byte and constructed by eight memory cells for convenience of the drawing, in reality, a plurality of memory circuits each having such a configuration are provided and selectively operated by an address signal, thereby constructing a memory circuit having a storage capacity of a plurality, of bytes.

In FIG. 9, 264 denotes a read/write control circuit for generating a signal for writing/reading a memory circuit on the basis of the control signals CS, RS, WR, and RD and data DB0 to DB17 from the control register 262. 254 denotes an internal power supply control circuit for generating power supply voltages VPP1M and VPP2M of a predetermined level which are necessary in the circuit on the basis of the write voltages VPP1 and VPP2 having a potential higher than the normal power supply voltage VCC necessary for writing. Further, 255 denotes a nonvolatile memory cell, and 256 denotes a read/write circuit of each memory cell. In the embodiment, eight pairs of memory cells and read/write circuits are arranged in one direction so that 8-bit data can be read/written at once. The write voltages VPP1 and VPP2 are, for example, 9V and 7V, respectively.

Reference letters LD0 to LD7 denote write data lines for transferring write data which is output from the read/write control circuit 264, and PU denotes a read control line for controlling reading. CG indicates a control gate line corresponding to a word line in a normal memory array for reading/writing 8-bit data. Further, SL denotes a write voltage supply line for supplying write voltage to the memory cell 255, PRGM denotes a write control line for controlling writing, and VER denotes a potential control line for controlling the potential of the memory cell. The control gate line CG is driven in accordance with an output of an EOR gate G0 for obtaining exclusive OR of the read control signal RE and the write control signal WE. LS1 and LS2 indicate level shifters for shifting the level of an output signal of the EOR gate G0 and the write control signal WE.

The read/write circuit 256 has an OR gate G1 that receives signals of any of the write data lines LD0 to LD7 and the write control line PRGM, and a transfer gate MOSFET Qt1 which makes an output signal of the OR gate G1 pass when a signal CERB is at the high level. The read/write circuit 256 also has a resistor R0 connected to the read control line PU, a transfer gate MOSFET Qt2 connected to the resistor R0 in series, and a sensing inverter G2 for determining whether the potential of the resistor R0 drops or not when the transfer gate MOSFET Qt2 is turned on. Although a fixed resistor is shown as the resistor R0 in the example, alternately, a circuit performing an operation corresponding to that of the fixed resistor may be employed.

The memory cell 255 has charge injection MOSFETs Qw1 and Qw2 connected between the transfer gate MOSFET Qt1 and the write voltage supply line SL so that their channels are in parallel with each other, and MOS capacitors C1 and C2 connected as capacitative elements between the gate terminals of the MOSFETs Qw1 and Qw2 and the control gate line CG. The memory cell 255 also has read MOSFETs Qr1 and Qr2 connected in series with the resistor R0 and the transfer gate MOSFET Qt2 between the read control line PU and the potential control line VER. The gate terminal of the charge injection MOSFET Qw1 and the gate terminal of the read. MOSFET Qr1 are connected to each other. The gate terminal of the charge injection MOSFET Qw2 and the gate terminal of the read MOSFET Qr2 are connected to each other. The gate terminals are floated.

Further, the gate terminals of the transfer gate MOSFETs Qt1 and Qt2 are connected to each other. The signal CERB obtained by inverting a control signal CER from the read/write control circuit 264 by an inverter is supplied to the common gate, and the gate MOSFETs Qt1 and Qt2 are controlled by the signal CERB. The potential control line VER for controlling the potential of the memory cell is driven by a level shifter LS3 which shifts the level of the signal obtained by inverting again the control signal CERB by an inverter.

In the memory cell 255 of the embodiment, a write voltage is applied across the source and drain of the MOSFETs Qw1 and Qw2 in accordance with write data in a state where the gate voltages of the charge injection MOSFETs Qw1 and Qw2 are set to be high by the control gate line CG via the MOS capacitors C1 and C2, thereby turning the MOSFETs Qw1 and Qw2 on or off. By injecting hot electrons generated by selectively passing the drain current to the MOSFETs Qw1 and Qw2 to the gate electrodes of the MOSFETs Qw1 and Qw2, data is written. Two charge injection MOSFETs and two read MOSFETs are provided to prevent deterioration in reliability of stored data caused by leak of charges.

At the time of reading data, the gate voltage of the read MOSFETs Qr1 and Qr2 is increased via the MOS capacitors C1 and C2 by using the control gate line CG. In addition, the potential of the read control line PU is increased and the potential of the potential control line VER is decreased, thereby giving a potential difference between the source and drain of the MOSFETs Qr1 and Qr2. Whether current flows in the MOSFETs Qr1 and Qr2 or not is detected by the inverter G2.

Concretely, when charges are injected to the gate electrodes of the charge injection MOSFETs Qw1 and Qw2, the gate voltages of the read MOSFETs Qr1 and Qr2 become relatively low to set an off state, and the drain current is interrupted. On the other hand, when charges are not injected to the gate electrodes of the charge injection MOSFETs Qw1 and Qw2, the gate voltages of the read MOSFETs Qr1 and Qr2 become relatively high to set an on state, and the drain current flows. It makes the potential of the connection node between the resistor R0 and the MOSFET Qr1 change. By detecting the potential change in the inverter G2, the state of the memory cell can be determined.

In the embodiment, even when charges of the gate electrode of one of the charge injection MOSFETs Qw1 and Qw2 are leaked in the reading operation, if charges of the other gate electrode are not leaked, one of the MOSFETs is turned off and no drain current flows. Therefore, deterioration in reliability of stored data due to leakage of charges can be prevented. Also in the case where a memory cell is constructed by using one of the charge injection MOSFETs Qw1 and Qw2 and one of the read MOSFETs Qr1 and Qr2, the memory cell operates effectively, so that one of the sets can be omitted. The memory circuit 250 of the embodiment of FIG. 1 is not limited to a memory circuit having a configuration as shown in FIG. 9 but may be a circuit having similar functions.

Figure 10:
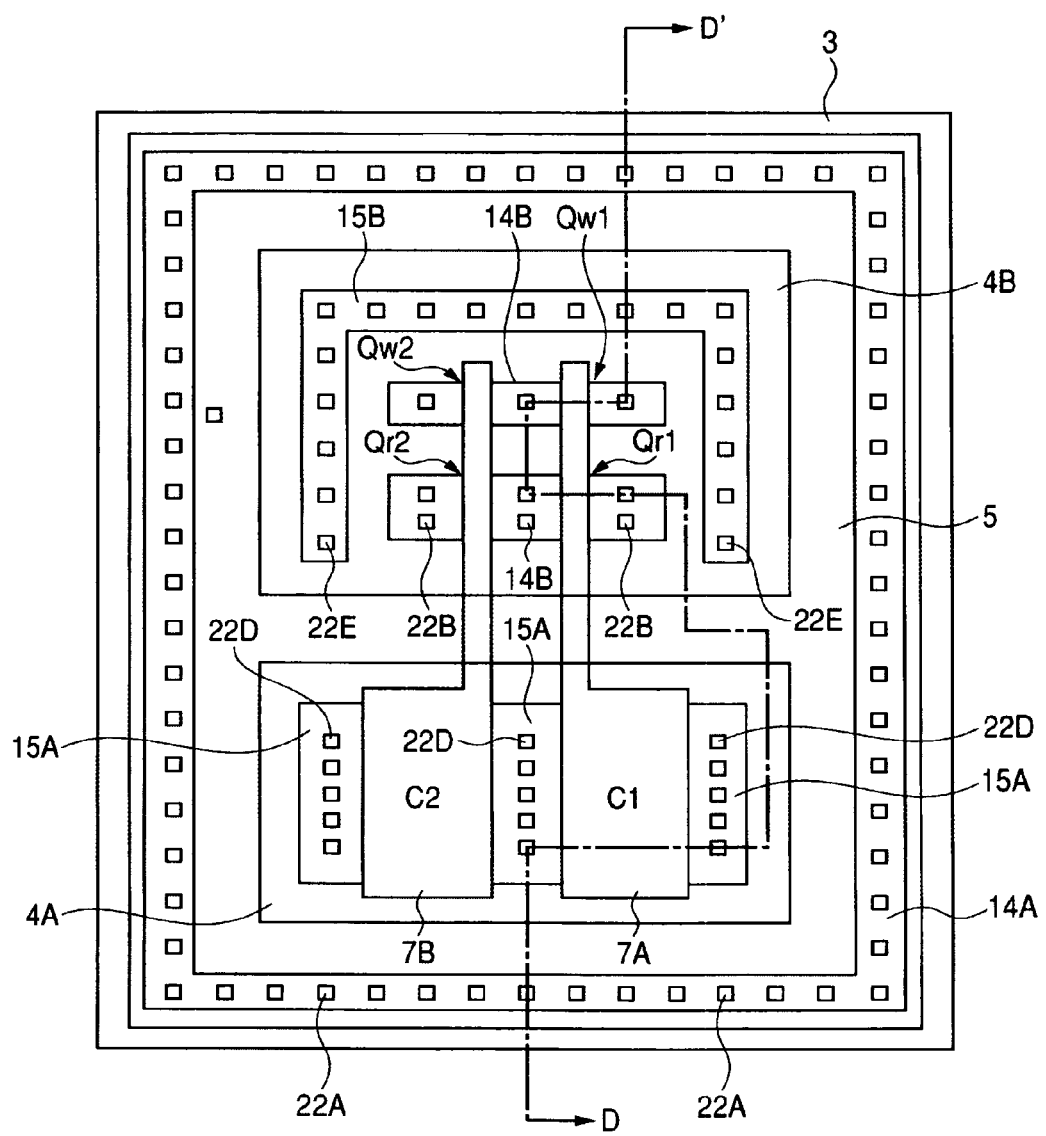
FIG. 10 is a plan view showing an example of the layout of memory cells constructing the nonvolatile memory circuit.
Figure 11:
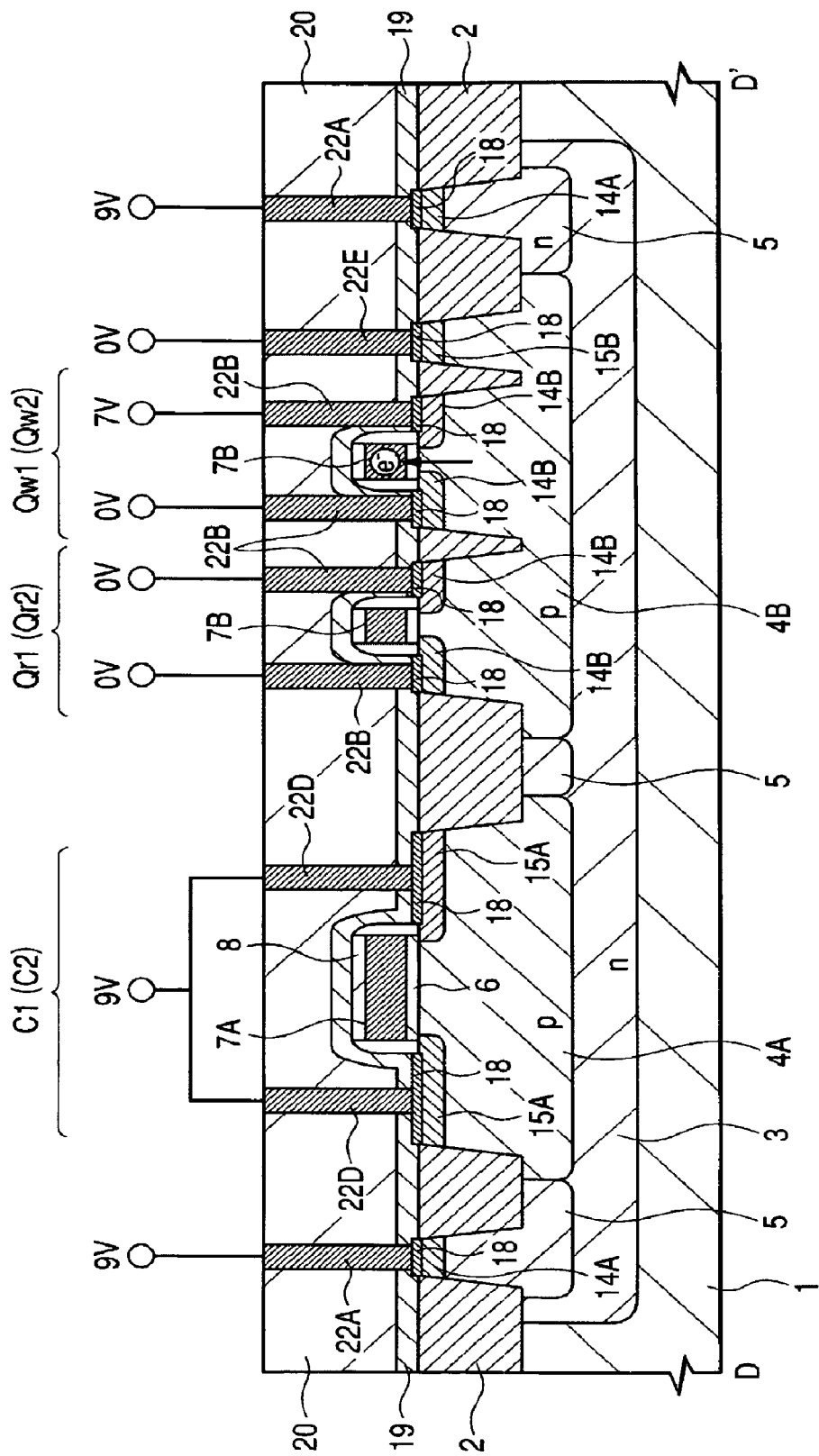
FIG. 11 is a cross section showing the structure of memory cells constructing the nonvolatile memory circuit and application voltages at the time of writing.
Figure 12:
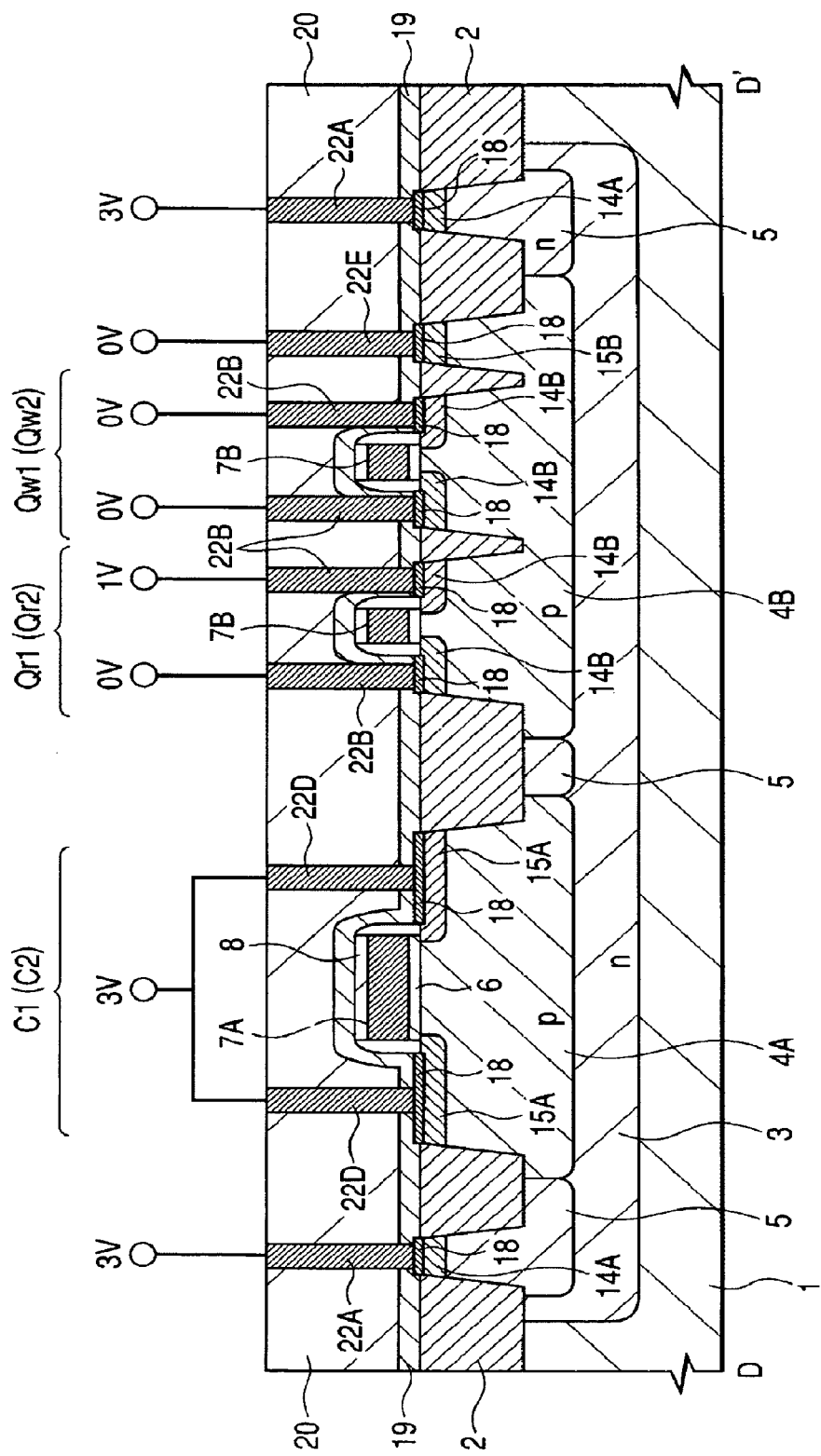
FIG. 12 is a cross section showing the structure of memory cells constructing the nonvolatile memory circuit and application voltages at the time of reading.
Figure 13:
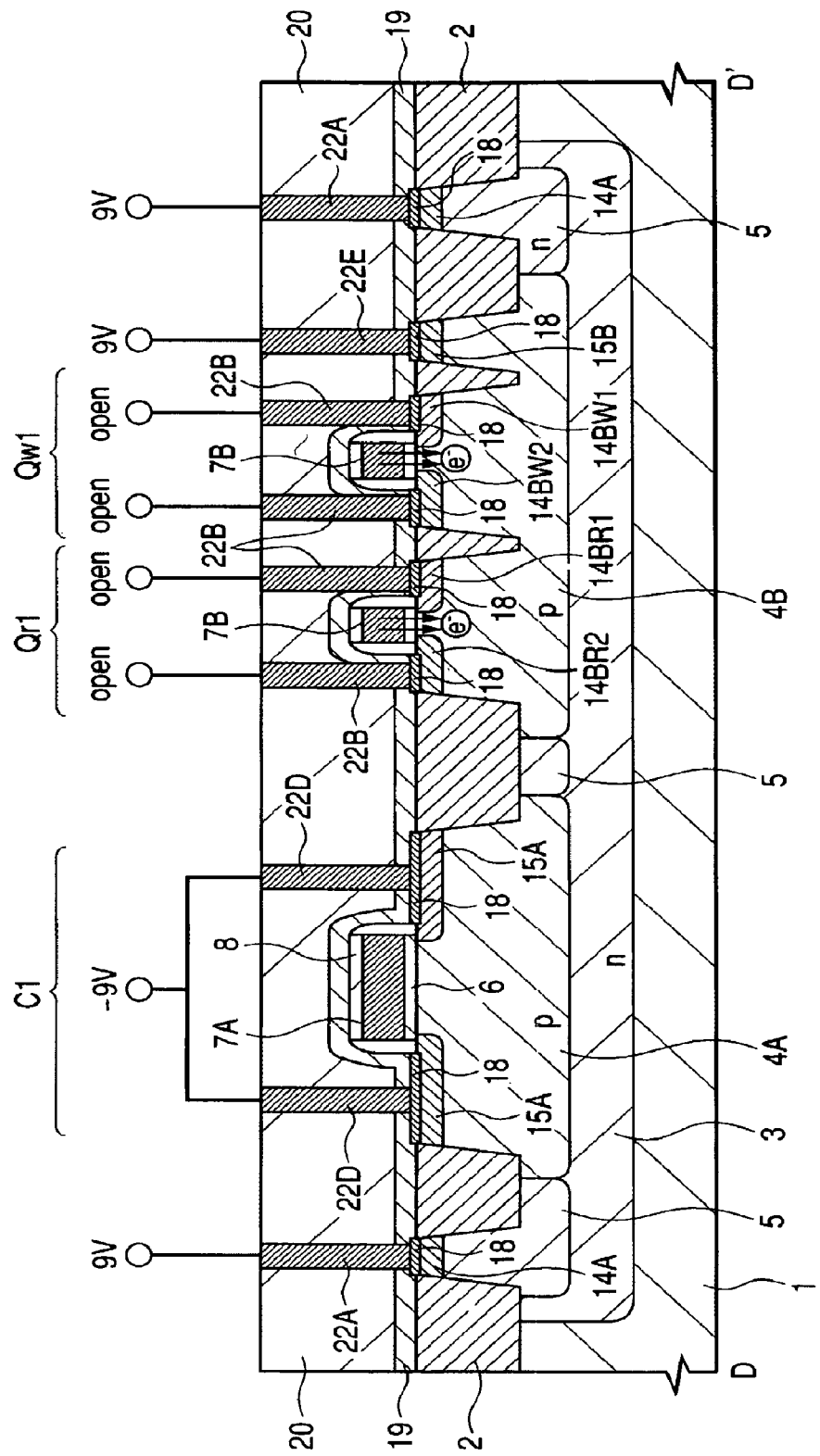
FIG. 13 is a cross section showing the structure of memory cells constructing the nonvolatile memory circuit and application voltages at the time of erasing.

A concrete device structure of a nonvolatile memory used for the liquid crystal control driver of the embodiment and operations of writing, erasing, and reading data in the nonvolatile memory will be described with reference to FIGS. 10 to 13. FIG. 10 is a plan view of a main part of a memory cell region. FIGS. 11 to 13 are sections taken along line D-D' of FIG. 10.

In the diagrams, reference numeral 1 denotes a p-type semiconductor substrate made of, for example, a single crystal silicon, reference numeral 2 denotes a field oxide film selectively formed on the surface of the substrate 1, and reference numerals 19 and 20 denote interlayer insulating films formed so as to cover the surface of the substrate 1 and the field oxide film 2. 4A indicates a p-type well region in which the MOS capacitors C1 and C2 are formed, 4B indicates a p-type well region in which the MOSFETs Qw1, Qw2, Qr1, and Qr2 are formed, and 3 denotes an n-type semiconductor isolation region provided under the p-type well regions 4A and 4B. Reference numeral 5 denotes an n-type semiconductor region as a power supply region for applying potential to the n-type semiconductor isolation region 3. 14A denotes an n-type semiconductor region as a buffer layer of the n-type semiconductor region 5, and 14B denotes an n-type semiconductor region as source and drain regions of the MOSFETs Qw1 and Qr1 (Qw2 and Qr2).

15A denotes a p-type semiconductor region as one terminal of the MOS capacitor C1, and 15B denotes a p-type semiconductor region as a power supply region for giving potential to the p-type well region 4B of the MOSFETs Qw1 and Qr1. 18 indicates a contact layer for reducing contact resistance with an electrode formed on the surface. Further, 6 indicates a dielectric layer of the MOS capacitor C1. The dielectric layer 6 is formed in the same process as the gate insulating film of the MOSFETs Qw1 and Qr1. 7A denotes a conductive layer as the other terminal of the MOS capacitor C1, and 7B denotes gate electrodes of the MOSFETs Qw1 and Qr1. The conductive layer 7A is formed in the same process as the gate electrodes of the MOSFETs Qw1 and Qr1.

At the time of writing, as shown in FIG. 11, for example, 9V is applied to the n-type semiconductor isolation region 3 via the n-type semiconductor region 5, and 0V is applied to the p-type well region 4B in which the MOSFETs Qw1 and Qr1 (Qw2 and Qr2) are formed via the p-type semiconductor region 15B. 9V in the forward direction is applied to the p-type well region 4A in which the MOS capacitor C1 (C2) is formed via the p-type semiconductor region 15A. Since the gate electrode 7B of the MOSFETs Qw1 and Qr1 (Qw2 and Qr2) and the electrode 7A as one of terminals of the MOS capacitor C1 (C2) are connected to each other, the potential of the electrode 7B is increased by application of 9V to the p-type well region 4.

7V is applied to one of the n-type semiconductor regions 14B as the source and drain of the MOSFET Qw1 (Qw2) for writing data, and 0V is applied to the other n-type semiconductor region 14B. Further, 0V is applied to the n-type semiconductor regions 14B as source and drain of the data read MOSFET Qr1 (Qr2). With the operation, current flows in the channel of the data write MOSFET Qw1 (Qw2), hot electrons (e-) generated at that time are injected to the gate electrode 7B, and data is written. 9V is applied to the n-type semiconductor isolation region 3 to prevent the PN junction from being biased in the forward direction when 9V is applied to the p-type well region 4A.

At the time of reading data, as shown in FIG. 12, for example, 3V is applied to the n-type semiconductor isolation region 3 via the n-type semiconductor region 5, and 0V is applied to the p-type well region 4B in which the MOSFETs Qw1 and Qr1 (Qw2 and Qr2) are formed via the p-type semiconductor region 15B. 3V is applied to the p-type well region 4A in which the MOS capacitors C1 and C2 are formed via the p-type semiconductor region 15A. By application of 3V to the p-type well region 4A, the potentials of the electrodes 7A and 7B are increased. According to whether charges are accumulated in the electrode 7B or not, the data reading MOSFETs Qr1 and Qr2 are turned on or off.

The n-type semiconductor regions 14B as the source and drain of the data writing MOSFET Qw1 (Qw2) is set to 0V, 1V is applied to one of the n-type semiconductor regions 14B as the source and drain of the data reading MOSFET Qr1 (Qr2), and the voltage at the time of connecting, for example, one of the resistors R0 shown in FIG. 9 is applied to the other n-type semiconductor region 14B. As described above, one end of the resistor R0 shown in FIG. 9 is connected to the read control line PU. At this time, current flows or does not flow according to the on/off state of the data reading MOSFETs Qr1 and Qr2. The current flow state is detected by the inverter G2. 3V is applied to the n-type semiconductor isolation region 3 for the reason that, by applying 3V to the p-type well region 4A, the PN junction is prevented from being biased in the forward direction.

Figure 14:
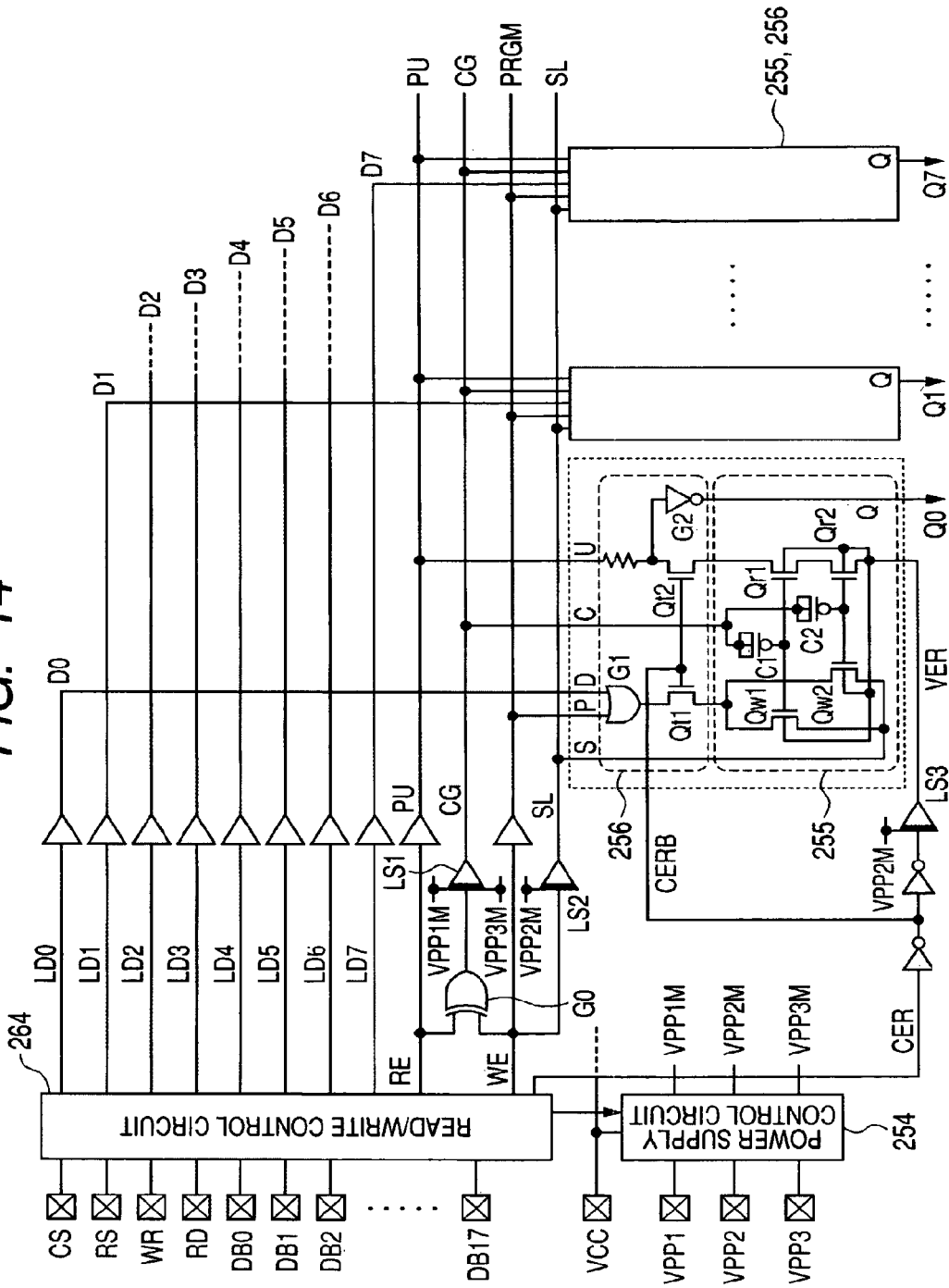
FIG. 14 is a circuit diagram showing an example of a memory circuit suitable for a user information storing region in the nonvolatile memory circuit.

FIG. 14 shows an example of a memory circuit suitably used for the second region 252 for storing information to be set by the user of the nonvolatile memory circuit 250 of FIG. 1. The nonvolatile memory circuit 250 of the embodiment is constructed without using nonvolatile memory elements such as FAMOS and MNOS in a manner similar to the nonvolatile memory circuit 250 of the embodiment of FIG. 9. The nonvolatile memory circuit 250 of the embodiment has a configuration that stored data can be erased. By setting "1" to each of the control bits OP0 and OP1 of the control register 262, the nonvolatile memory circuit 250 enters an erasure mode, and data can be erased.

Since the nonvolatile memory circuit 250 of the embodiment has a configuration which is almost the same as that of the nonvolatile memory circuit 250 of FIG. 9, the description of the same configuration part will not be repeated but only the different points will be described. The first different point from the nonvolatile memory circuit 250 of the embodiment of FIG. 9 is that, in the embodiment of FIG. 14, the power supply circuit 254 can generate an internal voltage VPP3M based on the third voltage VPP3 supplied from the outside. The second different point is that the internal voltage VPP3M is supplied as a power supply voltage on the low level side to the level shifter LS1 for driving the control gate line CG.

The internal voltage VPP3M is set to the ground potential such as 0V at the time of writing/reading data, and is set to a potential such as −9V at the time of erasing data. The internal voltage VPP3M is applied to the MOS capacitors C1 and C2 connected to the floating gate via the control gate line CG. As the MOSFETs Qw1, Qw2, Qr1, and Qr2 constructing the nonvolatile memory cell 255, elements having the layout and structure shown in FIGS. 10 and 11 can be used.

In the memory circuit constructed by the elements having such a configuration, to erase data, as shown in FIG. 13, for example, 9V is applied to the n-type semiconductor region 3 via the n-type semiconductor region 5, and 9V is applied to the p-type well region 4B in which the MOSFETs Qw1 and Qr1 (Qw2 and Qr2) are formed via the p-type semiconductor region 15B. −9V in the opposite direction is applied to the p-type well region 4A in which the MOS capacitor C1 (C2) is formed via the p-type semiconductor region 15A. Further, n-type semiconductor regions 14BW1 and 14BR1 as the source regions of the data write MOSFET Qw1 (Qw2) and the data-read MOSFET Qr1 (Qr2) are set to an open-circuit potential, and 9V is applied to n-type semiconductor regions 14BW2 and 14BR2 as drain regions of the MOSFETs Qw1 (Qw2) and Qr1 (Qr2).

The area of the capacitative electrode (gate electrodes 7A) of the MOS capacitors C1 and C2 is larger than that of the capacitive electrodes (gate electrodes 7B) for generating gate capacitance of the MOSFETs Qw1 and Qw2 (refer to FIG. 10), so that the capacitance of the MOS capacitors C1 and C2 is larger than the gate capacitance of the MOSFETs Qw1 and Qw2. Consequently, the voltage applied to the gate capacitors of the MOSFETs Qw1 and Qw2 is higher than the voltage applied to the MOS capacitors C1 and C2. As a result, electrons (e-) accumulated in the common gate electrodes 7B of the data write MOSFETs Qw1 and Qw2 and the data read MOSFETs Qr1 and Qr2 are released to the p-type well region 4B by the FN tunneling phenomenon.

A negative voltage (in the backward direction) is applied to the p-type well region 4A in which the MOS capacitors C1 and C2 are formed, and a positive voltage (in the forward direction) is applied to the p-type well region 4B in which the MOSFETs Qw1, Qw2, Qr1, and Qr2 are formed. In such a manner, a potential difference (18V) necessary for the data erasing operation can be assured with a voltage (9V or less) which does not cause gate destruction can be assured. 9V is applied to the n-type semiconductor isolation region 3 for the reason that, by applying 9V to the p-type well region 4B, the PN junction is prevented from being biased in the forward direction. By using the memory circuit with such a configuration, data can be written a plurality of times.

Figure 15:
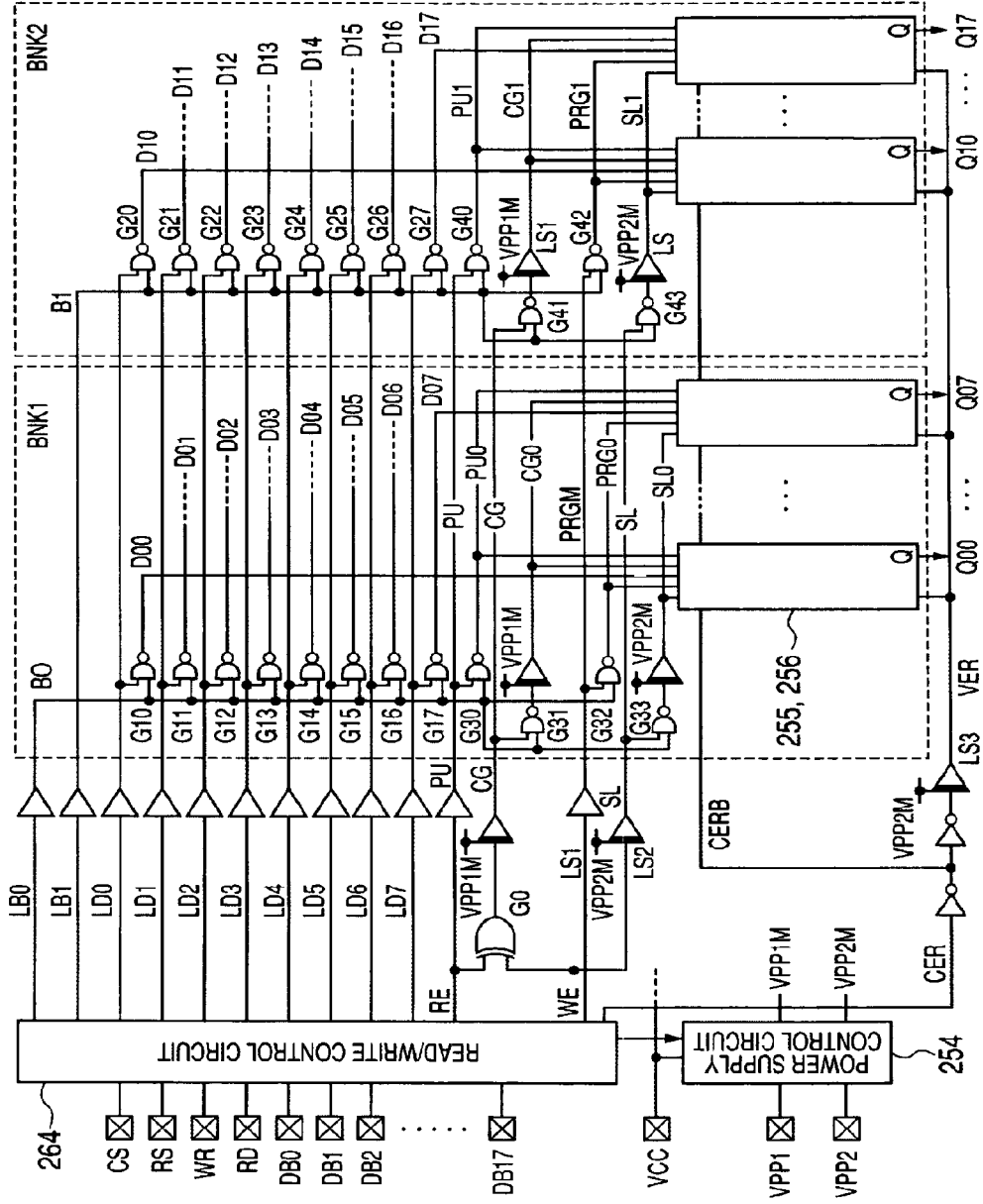
FIG. 15 is a circuit diagram showing another example of a memory circuit suitable for a user information storing region.

FIG. 15 shows another example of a memory circuit suitably used for the second region 252 for storing information to be set by the user of the nonvolatile memory circuit 250 in FIG. 1. The nonvolatile memory circuit 250 of the example is also constructed only by P-channel MOSFETs and N-channel MOSFETs as normal circuit configuration elements without using nonvolatile storage elements such as FAMOS and MNOS. The nonvolatile memory circuit 250 of the example is a circuit in the case where erasure of stored data is not assumed.

In the example, to enable data to be written a plurality of times, two banks BNK1 and BNK2 having the same storage capacity are provided. Each of the banks includes a memory cell having the same configuration as that of the memory cell 255 shown in FIG. 9, and one of the banks BNK1 and BNK2 is selected by bank instruction signals B0 and B1 output from the read/write control circuit 264.

More concretely, NAND gates G10 to G17 and NAND gates G20 to G27 receiving signals on write data lines LD0 to LD7 through which write data output from the read/write control circuit 264 is transmitted and one of the bank instruction signals B0 and B1 are provided. NAND gates G30, G31, G32, and G33 receiving the bank instruction signal B0 and signals on the control lines PU, CG, PRGM, and SL, and NAND gates G40, G41, G42, and G43 receiving the bank instruction signal B1 and signals on the control lines PU, CG, PRGM, and SL are provided.

By validating either the NAND gates G10 to G17 and G30 to G33 or the NAND gates G20 to G27 and G40 to G43 in accordance with the bank instruction signals B0 and B1, one of the sets of banks is selected. Therefore, a memory circuit capable of seemingly rewriting data is realized. It is also possible to provide a mechanism in the chip such that after data is written into one set of banks, in the next writing operation, the other set of banks is automatically selected. With the mechanism, overwriting of data by an erroneous process of the user can be prevented. Although the number of banks is two in the embodiment, three or more banks may be provided. In this case, a memory circuit capable of rewriting twice or more times. Thus, a memory circuit capable of seemingly rewriting data twice or more times is realized.

Figure 16:
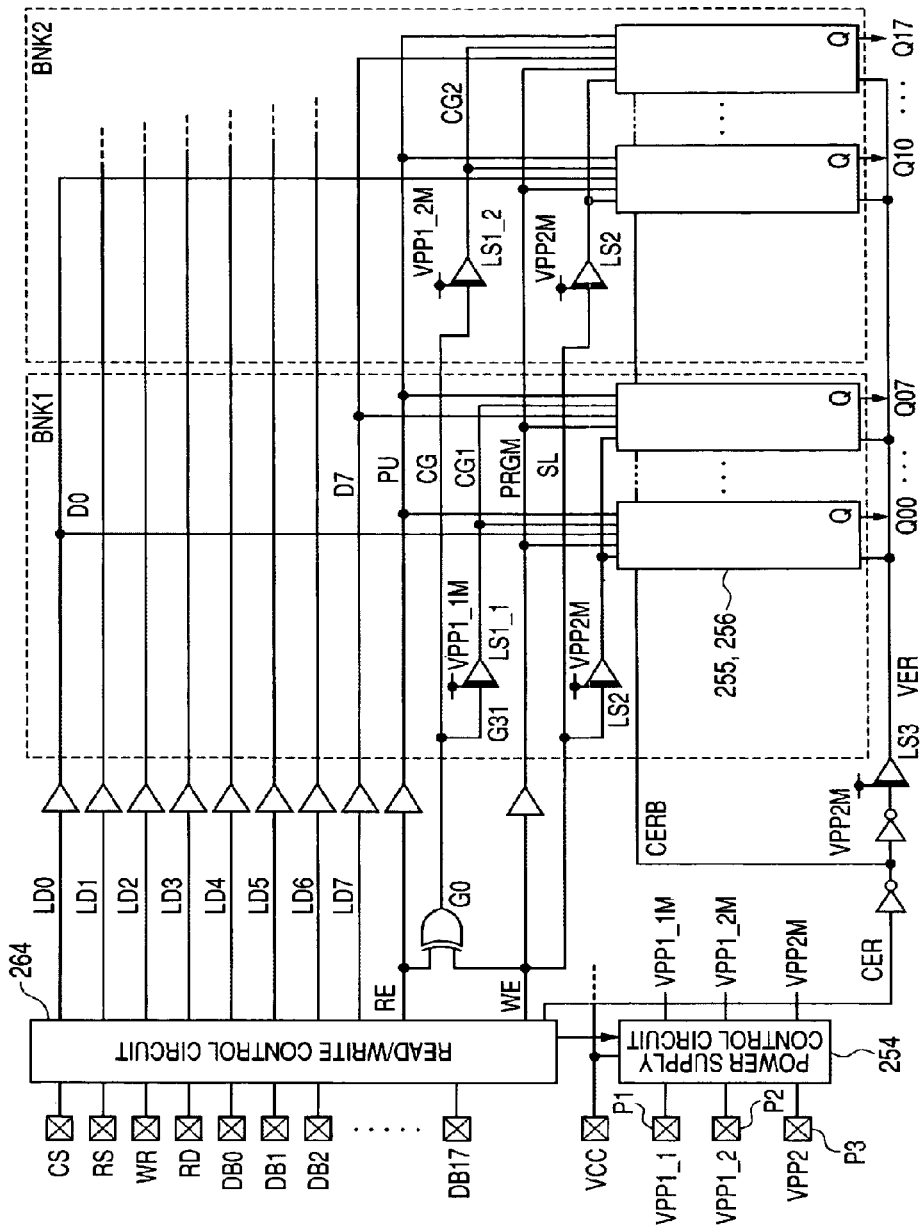
FIG. 16 is a circuit diagram showing further another example of the memory cell suitable for the user information storing region.

FIG. 16 shows further another example of the memory circuit suitably used for the second region 252 for storing information set by the user of the nonvolatile memory circuit 250 in FIG. 1.

In the example, to enable data to be written a plurality of times, two banks BNK1 and BNK2 having the same storage capacity are provided. Each of the banks includes a memory cell having the same configuration as that of the memory cell 255 shown in FIG. 7 and, as the control gate line CG to which memory cells are connected, a common gate line CG and gate lines CG1 and CG2 for the banks BNK1 and BNK2 are provided. Further, the power supply circuit 254 is provided with power supply terminals P1 and P2 for applying a write voltage VPP1-1 for the bank BNK1 and a write voltage VPP1-2 for the bank. BNK2.

Internal write voltages VPP1-1M and VPP1-2M generated on the basis of the voltages applied to the power supply terminals are supplied to level shifters LS1-1 and LS1-2 for driving the gate lines CG1 and CG2 for the banks BNK1 and BNK2, respectively. With the configuration, when the write voltage VPP1-1 is applied to the power supply terminal P1, writing of data to the bank BNK1 is enabled. When the write voltage VPP1-2 is applied to the power supply terminal P2, writing of data to the bank BNK2 is enabled.

By switching the terminals to which the write voltage is applied, the banks to which data is written can be switched. Thus, a memory circuit capable of seemingly rewriting data is realized. It is also possible to supply the write voltage VPP2 to each of the banks. Further, the number of banks and the number of terminals to which the write voltage is applied may be set to three or more.

Figure 17:
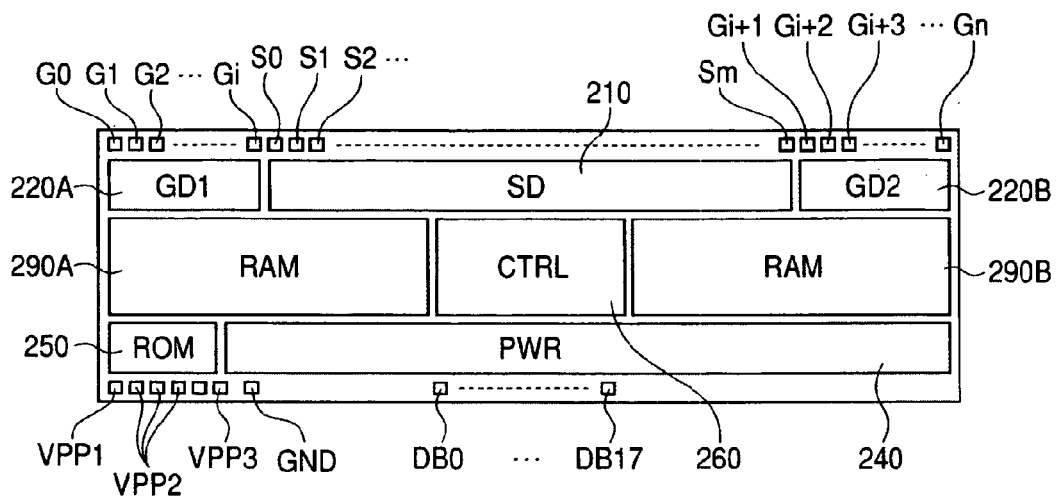
FIG. 17 is a plan view showing an example of the layout on a semiconductor chip of circuit blocks constructing the liquid crystal control driver IC of the embodiment.

FIG. 17 shows an example of the layout of the semiconductor chip of circuit blocks constructing the liquid crystal controller driver IC of the embodiment. In FIG. 17, the same reference numerals are designated to the same circuits as those shown in FIG. 1. Reference letters G0 to Gi and Gi+1 to Gn denote terminals (output pads) outputting gate drive signals generated by the gate driver 220, and reference letters S0 to Sm denote terminals (output pads) outputting source line drive signals generated by the source driver 210.

VPP1 to VPP3 and GND denote power supply terminals (power supply pads) to which power supply voltage for writing ROM supplied from the outside are applied, and DB0 to DB17 denote terminals (input pads) to which signals supplied from the CPU via a bus are input. Although not limited, for a liquid crystal panel having gate drive signal input terminals on its right and left sides, the terminals (output pads) outputting the gate drive signals are divided into the two groups G0 to Gi and Gi+1 to Gn which are provided on both sides so as to sandwich the terminals (output pads) S0 to Sm outputting source line drive signals.

As understood from FIG. 17, in the liquid crystal controller driver IC of the embodiment, the output pads G0 to Gi, Gi+1 to Gn, and S0 to Sm are disposed along one side in the longitudinal direction of the semiconductor chip, and input pads DB0 to DB17 are disposed along the side on the opposite side. In correspondence with the output pads G0 to Gi, Gi+1 to Gn, and S0 to Sm, a gate driver 220A, a source driver 210, and a gate driver 220B are disposed on one side of the chip. In almost the center of the chip, a circuit such as a timing controller (280) as a component of the controller 260 is disposed, and RAMs 290A and 290B for storing display data are disposed on both sides of the circuit.

Further, a ROM 250 is disposed close to power supply pads VPP1 to VPP3, and a power supply circuit 240 for generating power for an LCD is disposed close to the input pads DB0 to DB17. Since the ROM 250 is disposed close to the power supply pads VPP1 to VPP3 to which the power supply voltage for writing the ROM is applied, the power supply line from the pads to the circuit is shortened, and a power loss is suppressed. In addition, the power supply pads VPP1 to VPP3 to which the relatively-high power supply voltage for writing the ROM is applied are provided at a corner of the chip. Thus, an electrostatic withstand voltage generated between the power supply pads VPP1 to VPP3 and the other pads can be increased. In the embodiment, to further increase the electrostatic withstand voltage, the interval between the power supply pads VPP1 to VPP3 and the ground pad GND is made wider than each of intervals of the power supply pads VPP1 to VPP3.

Figure 18:
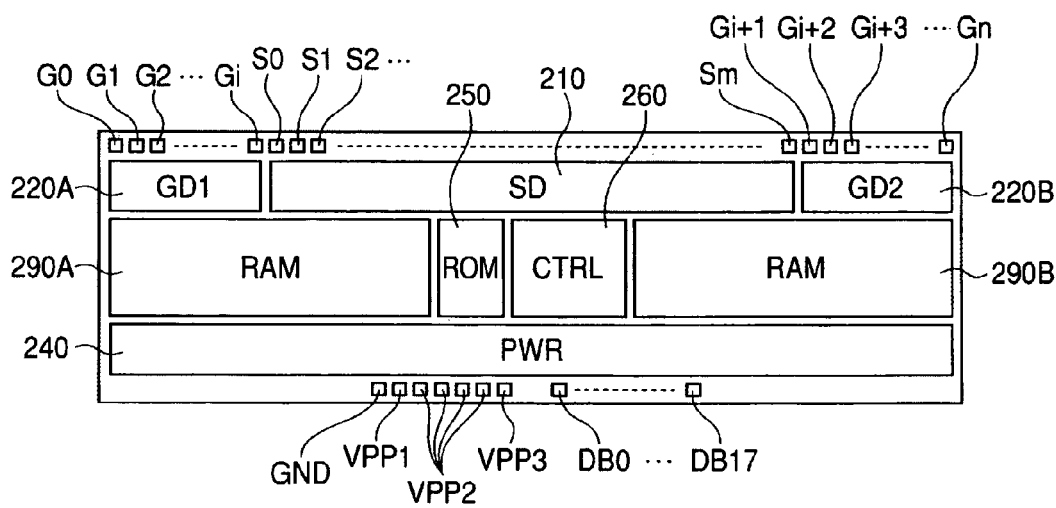
FIG. 18 is a plan view showing another example of the layout on a semiconductor chip of circuit blocks constructing the liquid crystal control driver IC of the embodiment.

FIG. 18 shows another example of the layout of a semiconductor chip of circuit blocks constructing the liquid crystal controller driver IC of the embodiment. In FIG. 18, the same reference numerals are designated to the same circuits and terminals as those shown in FIG. 17 and their description will not be repeated. In the example of FIG. 18, the ROM 250 is disposed adjacent to the controller 260 disposed almost in the center of the chip.

In a liquid crystal controller driver IC, to transfer write data and read data, the number of lines connecting the controller 260 and the ROM 250 is relatively large. Consequently, when the controller 260 and the ROM 250 are apart from each other, the area occupied by the lines is large and it causes increase in the chip size. Therefore, by employing the layout as shown in the embodiment, there are advantages such that the area occupied by the lines is reduced and the chip size can be reduced. The embodiment is effective when applied to the case where the storage capacity of the ROM 250 is large.

Although the present invention achieved by the inventors herein has been concretely described on the basis of the embodiments, obviously, the invention is not limited to the foregoing embodiments but can be variously changed without departing from its gist. For example, a memory cell is provided with two charge injection MOSFETs and two read MOSFETs in order to prevent the reliability of storage data from deteriorating due to leak of charges. Alternately, a memory cell may be provided with one charge injection MOSFET and one read MOSFET.

Although the case where only the second region 252 for storing information set by the user is rewritable has been described in the foregoing embodiment, it is also possible to set the number banks of the memory circuit in the first region 251 for storing information to be set by the manufacturer to two and rewrite data in the region only once seemingly.

The liquid crystal control driver for driving a TFT liquid crystal panel in which charges are injected to pixel electrodes by a thin film transistor as a three-terminal switching element in the field of utilization as the background of the present invention achieved by the inventors herein has been mainly described. The invention is not limited to the liquid crystal control driver but can be applied to a liquid crystal control driver for driving an MIM liquid crystal panel in which charges are injected to pixel electrodes by a two-terminal switching element, and the like.

What is claimed is:

1. A semiconductor integrated circuit device for generating and outputting a drive signal applied to a scan line of a display panel to be driven and a drive signal applied to a signal line of the display panel, the semiconductor integrated circuit device comprising:
   a nonvolatile memory,
   wherein the nonvolatile memory has an element formed by a semiconductor manufacturing process of forming an element of another circuit on a same semiconductor chip as the semiconductor integrated circuit device,
   wherein the nonvolatile memory comprises an electrically erasable programmable area to store setting information adapted to characteristics of the display panel driven by the semiconductor integrated circuit device,
   wherein the nonvolatile memory is comprised of multiple memory cells, each of said memory cells being isolated by an isolation area,
   wherein the each of said memory cells includes:
      a first field effect transistor for writing data in a first well formed in a main surface of a semiconductor substrate;
      a second field effect transistor for reading data in the first well formed in the main surface of the semiconductor substrate; and a third field effect transistor that functions as a capacitive element in a second well formed in the main surface of the semiconductor substrate and arranged to be isolated from the first well, wherein floating gates of the first field effect transistor, the second field effect transistor, and third field effect transistor are coupled together, and wherein a writing operation is performed when a common positive voltage is applied to a source and a drain of the third field effect transistor.

2. A semiconductor integrated circuit device according to claim 1, wherein the nonvolatile memory is constructed using said multiple memory cells each storing the same data.

3. A semiconductor integrated circuit device for driving a liquid crystal display panel, for generating and outputting a drive signal applied to a scan line of the liquid crystal display panel and a drive signal applied to a signal line of the liquid crystal display panel, and formed on a single semiconductor chip, the semiconductor integrated circuit device comprising:

an electrically erasable programmable nonvolatile memory, wherein the nonvolatile memory has an element formed by a semiconductor manufacturing process of forming an element of another circuit on the semiconductor chip, and wherein the semiconductor chip has a rectangular shape in plan view, wherein respective terminals for outputting the drive signal applied to the scan line and the drive signal applied to the signal line are disposed along a periphery in a longitudinal direction of the semiconductor chip, wherein a first power supply voltage terminal and a second power supply voltage terminal to which a high voltage for writing to the nonvolatile memory is applied and a third power supply voltage terminal to which a low voltage for erasing the nonvolatile memory is applied are disposed along another periphery in the longitudinal direction of the semiconductor chip, and wherein the nonvolatile memory is arranged so as to be adjacent to said first, second, and third power supply voltage terminals.

4. A semiconductor integrated circuit device for driving a liquid crystal display panel, for generating and outputting a drive signal applied to a scan line of the liquid crystal display panel and a drive signal applied to a signal line of the liquid crystal display panel, and formed on a single semiconductor chip, the semiconductor integrated circuit device comprising:

an electrically erasable programmable nonvolatile memory, wherein the nonvolatile memory has an element formed by a semiconductor manufacturing process of forming an element of another circuit on the semiconductor chip, and wherein the semiconductor chip has a rectangular shape in plan view, wherein terminals for outputting the drive signal applied to the scan line and the drive signal applied to the signal line are disposed along a periphery in a longitudinal direction of the semiconductor chip, wherein a first power supply voltage terminal to which a high voltage for writing to the nonvolatile memory circuit is applied, a second power supply voltage terminal to which a high voltage for writing to the nonvolatile memory is applied, and a third power supply voltage terminal to which a low voltage for erasing the nonvolatile memory is applied are disposed substantially in a center of another periphery in the longitudinal direction of the semiconductor chip, wherein a control circuit for writing and reading data to and from the nonvolatile memory is disposed substantially in a center portion of the semiconductor chip in plan view, and wherein the nonvolatile memory is disposed adjacent to the control circuit.

* * * * *